United States Patent
Herrera et al.

(10) Patent No.: US 11,716,566 B2
(45) Date of Patent: Aug. 1, 2023

(54) SEGMENTED TRANSDUCERS FOR ACOUSTIC APPLICATIONS

(71) Applicant: QUALCOMM Incorporated, San Diego, CA (US)

(72) Inventors: Bernard Herrera, Cambridge, MA (US); Jessica Liu Strohmann, Cupertino, CA (US); Changting Xu, Santa Clara, CA (US); Hrishikesh Vijaykumar Panchawagh, Cupertino, CA (US); Kostadin Dimitrov Djordjev, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 71 days.

(21) Appl. No.: 17/301,061

(22) Filed: Mar. 23, 2021

(65) Prior Publication Data
US 2022/0312115 A1   Sep. 29, 2022

(51) Int. Cl.
*H04R 3/12* (2006.01)
*G10K 11/178* (2006.01)
(Continued)

(52) U.S. Cl.
CPC .............. *H04R 3/12* (2013.01); *G06F 3/0416* (2013.01); *G06F 3/0436* (2013.01);
(Continued)

(58) Field of Classification Search
CPC .......... H04R 3/12; H04R 1/028; H04R 1/403; H04R 17/00; H04R 2499/15;
(Continued)

(56) References Cited

U.S. PATENT DOCUMENTS 6,546,803 B1   4/2003   Ptchelintsev et al.
7,372,777 B2   5/2008   Hurst et al.
(Continued)

FOREIGN PATENT DOCUMENTS

JP   2003116852 A   4/2003

OTHER PUBLICATIONS

International Search Report and Written Opinion—PCT/US2022/070517—ISA/EPO—dated Jul. 12, 2022.
(Continued)

*Primary Examiner* — Andrew L Sniezek
(74) *Attorney, Agent, or Firm* — Qualcomm Incorporated

(57) ABSTRACT

Some disclosed devices may include a display stack, a cover layer proximate a first side of the display stack and a segmented transducer array proximate a second side of the display stack. The segmented transducer array may include a plurality of separate transducer segments. Each of the separate transducer segments may include a piezoelectric layer and a thin-film transistor (TFT) layer. The separate transducer segments may include transmitter transducer segments and receiver transducer segments. In some examples, a spacing between at least a first plurality of the transmitter transducer segments may correspond to a display stack and cover layer oscillation mode frequency in a range from 20 Hz to 20 kHz, from 15 kHz to 200 kHz or from 20 kHz to 400 kHz.

36 Claims, 18 Drawing Sheets

(51) Int. Cl.
*G06F 3/041* (2006.01)
*G06F 3/043* (2006.01)
*H04R 1/02* (2006.01)
*H04R 1/40* (2006.01)
*H04R 17/00* (2006.01)

(52) U.S. Cl.
CPC ....... *G10K 11/17873* (2018.01); *H04R 1/028* (2013.01); *H04R 1/403* (2013.01); *H04R 17/00* (2013.01); *G10K 2210/3027* (2013.01); *H04R 2499/15* (2013.01)

(58) Field of Classification Search
CPC ...... G10K 11/17872; G10K 2210/3027; G06F 3/0416; G06F 3/0436
See application file for complete search history.

(56) References Cited

U.S. PATENT DOCUMENTS

| | | |
|---|---|---|
| 7,629,969 B2 | 12/2009 | Kent |
| 9,883,848 B2 | 2/2018 | Specht et al. |
| 9,904,836 B2 | 2/2018 | Yeke Yazdandoost et al. |
| 2015/0169136 A1 | 6/2015 | Ganti et al. |
| 2019/0343492 A1 | 11/2019 | Miyazawa et al. |
| 2020/0196082 A1 | 6/2020 | Heilemann et al. |
| 2021/0004555 A1* | 1/2021 | Panchawagh ......... H01L 41/047 |

OTHER PUBLICATIONS

Partial International Search Report—PCT/US2022/070517—ISA/EPO—dated May 18, 2022.

\* cited by examiner

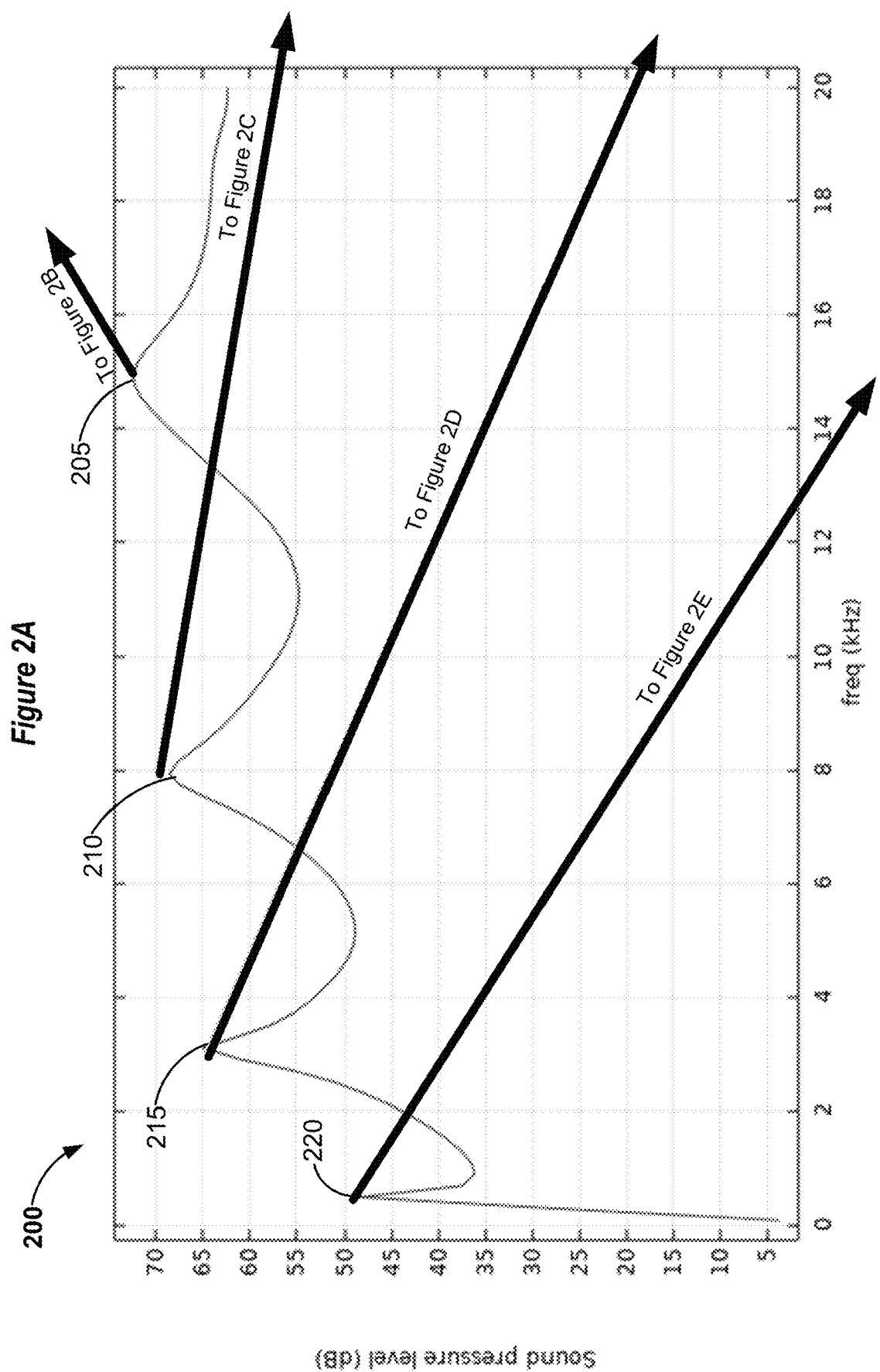

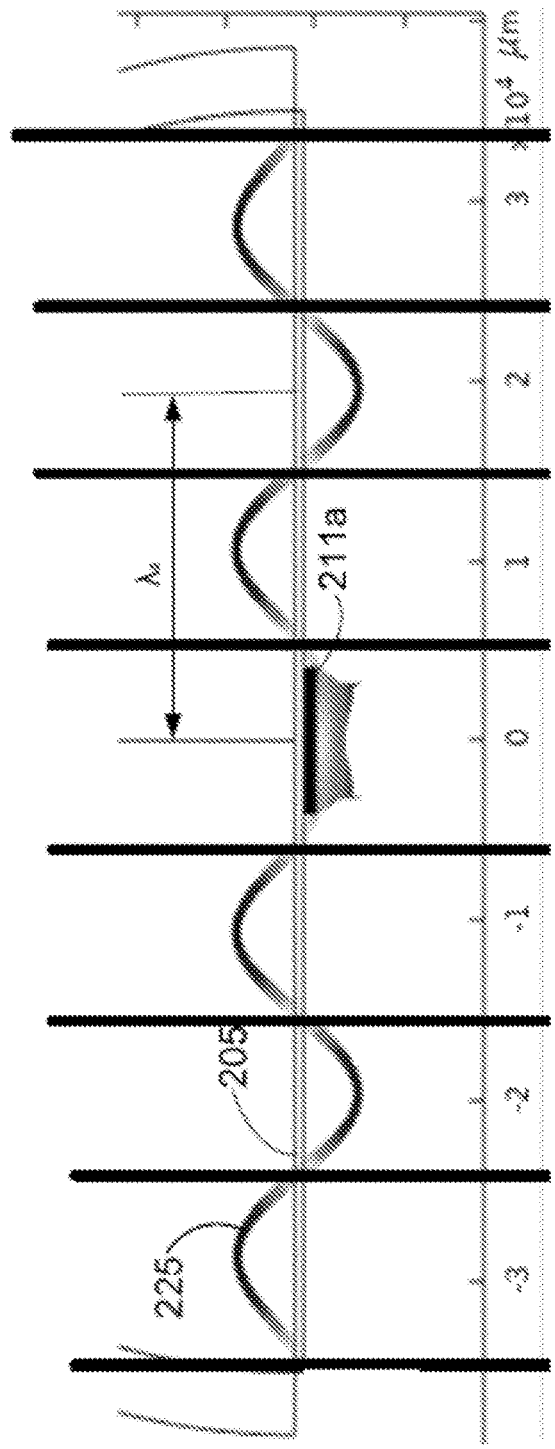
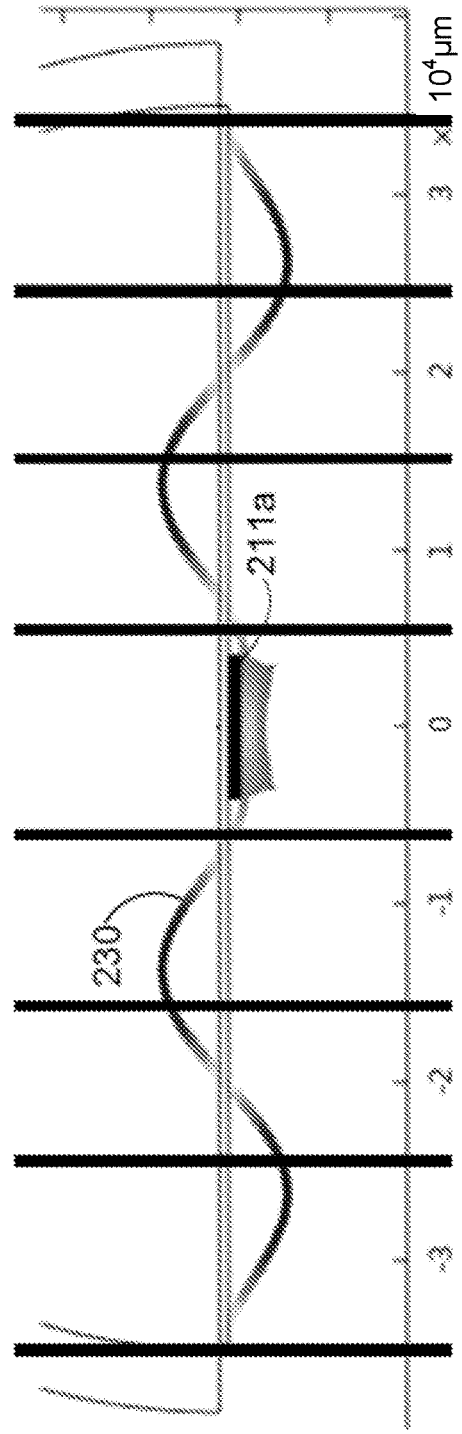
*Figure 2B*
*Figure 2C*

Figure 3A
Configuration 3
~10 dB boost compared to single transducer at ~14 kHz
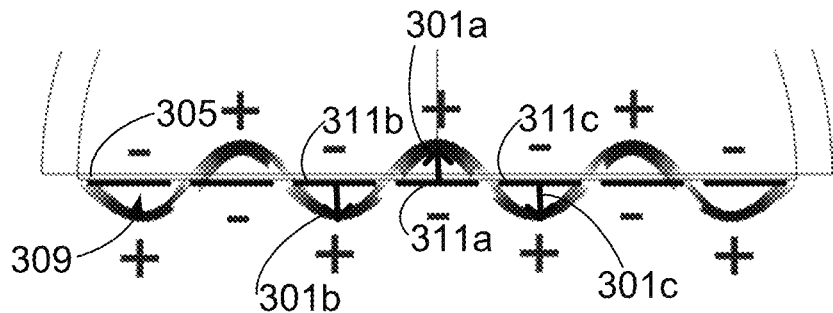
Figure 3B
Configuration 2
Displacement increase compared to single transducer at ~3 kHz
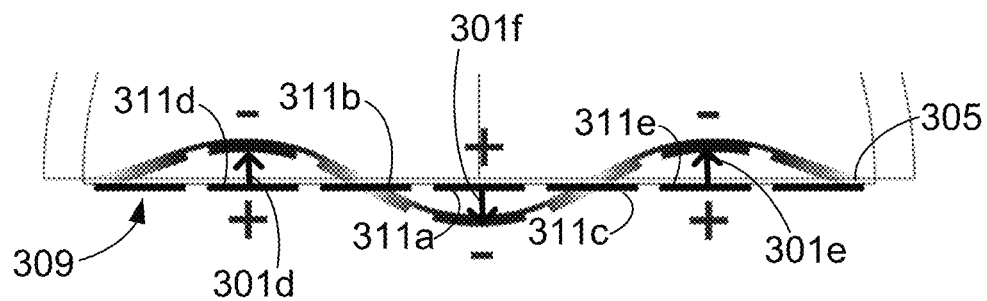
Configuration 1
~10 dB boost compared to single transducer at ~0.5 kHz
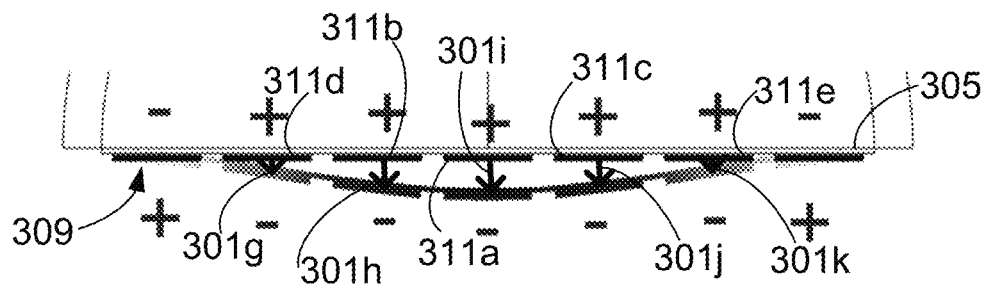
Figure 3C

SEGMENTED TRANSDUCERS FOR ACOUSTIC APPLICATIONS

TECHNICAL FIELD

This disclosure relates generally to transducers and related methods, including but not limited to acoustic transducers and methods for using acoustic transducers.

DESCRIPTION OF THE RELATED TECHNOLOGY

Many existing products include one or more acoustic transducers. Ultrasonic transducers can be used for biometric authentication, which is an important feature for controlling access to devices such as cell phones. Although some existing acoustic transducers provide satisfactory performance, improved methods and devices would be desirable.

SUMMARY

The systems, methods and devices of the disclosure each have several innovative aspects, no single one of which is solely responsible for the desirable attributes disclosed herein.

One innovative aspect of the subject matter described in this disclosure may be implemented in an apparatus. The apparatus may include a display stack and a cover layer proximate a first side of the display stack. The apparatus may include a segmented transducer array proximate a second side of the display stack. In some examples, the segmented transducer array may include a plurality of separate transducer segments. Each of the separate transducer segments may, in some examples, include a piezoelectric layer and a thin-film transistor (TFT) layer. In some implementations, the separate transducer segments may include transmitter transducer segments and receiver transducer segments. According to some examples, a spacing between at least a first plurality of the transmitter transducer segments may correspond to a display stack and cover layer oscillation mode frequency. In some implementations, the display stack and cover layer oscillation mode frequency may be in the range from 20 Hz to 20 kHz. In some examples, the display stack and cover layer oscillation mode frequency is in the range from 15 KHz to 200 KHz or in the range from 20 kHz-400 kHz.

Some implementations may include a control system. In some examples, at least part the control system is coupled (e.g. electrically or wirelessly coupled) to the segmented transducer array. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

According to some examples, the control system may be configured for controlling at least the first plurality of the transmitter transducer segments to reproduce audio signals by causing the display stack and the cover layer to oscillate at frequencies in a range from 20 Hz to 20 kHz.

In some examples, the control system may be configured to drive the transmitter transducer segments and/or to obtain receiver signals from the receiver transducer segments. According to some examples, the control system may be configured to perform noise cancellation based on receiver signals received from two or more receiver transducer segments. In some such examples, the control system may be further configured for detecting a gesture based, at least in part, on signals received via one or more of the receiver transducer segments. In some such examples, the control system may be configured for controlling at least the first plurality of the transmitter transducer segments to cause the display stack and the cover layer to oscillate at frequencies in a range from 20 kHz-400 kHz. According to some such examples, the control system may be configured for detecting a gesture based, at least in part, on ultrasonic signals received via one or more of the receiver transducer segments.

In some implementations, a spacing between at least a second plurality of the transmitter transducer segments may correspond to a display stack and cover layer oscillation mode for a frequency in a range from 20 Hz to 20 kHz.

According to some implementations, the control system may be further configured to perform noise cancellation based on receiver signals received from two or more receiver transducer segments.

In some implementations, a distance between centers of the first plurality of the transmitter transducer segments may equal a mode wavelength, half of the mode wavelength, a quarter of the mode wavelength or an eighth of the mode wavelength corresponding to the display stack and cover layer oscillation mode frequency. In such examples, a "mode wavelength" corresponds to a distance between peaks of a display stack and cover layer oscillation mode.

According to some examples, a transmitter segment thickness of each of the first plurality of the transmitter transducer segments may be different from a receiver segment thickness of each of a first plurality of the receiver transducer segments. In some such examples, a receiver segment piezoelectric layer thickness of each of the first plurality of the receiver transducer segments may be greater than a transmitter segment piezoelectric layer thickness of each of the first plurality of the transmitter transducer segments.

In some examples, a first subset of the separate transducer segments may have a first segment width and a second subset of the separate transducer segments may have a second segment width.

According to some examples, the control system may be configured to drive the transmitter transducer segments in a high-order mode. In some such examples, adjacent transmitter transducer segments of the first plurality of the transmitter transducer segments may be driven in opposite directions.

In some examples, the control system may be configured to drive the transmitter transducer segments in a medium-order mode. In some such examples, at a time during which a first transmitter transducer segment of the first plurality of the transmitter transducer segments may be driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

According to some examples, the control system may be configured to drive the transmitter transducer segments in a low-order mode. In some such examples, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

Other innovative aspects of the subject matter described in this disclosure may be implemented in an apparatus. The apparatus may include a display stack and a cover layer proximate a first side of the display stack. The apparatus may include a segmented transducer array proximate a second side of the display stack. In some examples, the segmented transducer array may include a plurality of separate transducer segments. Each of the separate transducer segments may, in some examples, include a piezoelectric layer and a thin-film transistor (TFT) layer. In some implementations, the separate transducer segments may include transmitter transducer segments and receiver transducer segments. According to some examples, a spacing between at least a first plurality of the transmitter transducer segments may correspond to a display stack and cover layer oscillation mode frequency. In some implementations, the display stack and cover layer oscillation mode frequency may be in the range from 20 kHz-400 kHz.

According to some examples, a distance between centers of the first plurality of the transmitter transducer segments may equal a mode wavelength, half of the mode wavelength, a quarter of the mode wavelength or an eighth of the mode wavelength corresponding to the display stack and cover layer oscillation mode frequency.

Other innovative aspects of the subject matter described in this disclosure may be implemented in a method of controlling a segmented transducer array. According to some examples, the method may involve controlling at least a first plurality of transmitter transducer segments of the segmented transducer array to reproduce audio signals by causing the display stack and the cover layer to oscillate at frequencies in a range from 20 Hz to 20 kHz.

In some examples, the method may involve driving the transmitter transducer segments and/or to obtain receiver signals from the receiver transducer segments. According to some examples, the method may involve performing noise cancellation based on receiver signals received from two or more receiver transducer segments. In some such examples, the method may involve detecting a gesture based, at least in part, on signals received via one or more of the receiver transducer segments. In some such examples, the method may involve controlling at least the first plurality of the transmitter transducer segments to cause the display stack and the cover layer to oscillate at frequencies in a range from 20 kHz-400 kHz. According to some such examples, the method may involve detecting a gesture based, at least in part, on ultrasonic signals received via one or more of the receiver transducer segments.

In some implementations, a spacing between at least a second plurality of the transmitter transducer segments may correspond to a display stack and cover layer oscillation mode for a frequency in a range from 20 Hz to 20 kHz.

According to some implementations, the method may involve perform noise cancellation based on receiver signals received from two or more receiver transducer segments.

In some implementations, a distance between centers of the first plurality of the transmitter transducer segments may equal a mode wavelength, half of the mode wavelength, a quarter of the mode wavelength or an eighth of the mode wavelength corresponding to the display stack and cover layer oscillation mode frequency. In such examples, a "mode wavelength" corresponds to a distance between peaks of a display stack and cover layer oscillation mode.

According to some examples, a transmitter segment thickness of each of the first plurality of the transmitter transducer segments may be different from a receiver segment thickness of each of a first plurality of the receiver transducer segments. In some such examples, a receiver segment piezoelectric layer thickness of each of the first plurality of the receiver transducer segments may be greater than a transmitter segment piezoelectric layer thickness of each of the first plurality of the transmitter transducer segments.

In some examples, a first subset of the separate transducer segments may have a first segment width and a second subset of the separate transducer segments may have a second segment width.

According to some examples, the method may involve driving the transmitter transducer segments in a high-order mode. In some such examples, adjacent transmitter transducer segments of the first plurality of the transmitter transducer segments may be driven in opposite directions.

In some examples, the method may involve driving the transmitter transducer segments in a medium-order mode. In some such examples, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

According to some examples, the method may involve driving the transmitter transducer segments in a low-order mode. In some such examples, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented in one or more non-transitory media having software stored thereon. For example, the software may include instructions for controlling one or more devices to perform one or more (in some instances, all) of the disclosed methods of controlling a segmented transducer array.

BRIEF DESCRIPTION OF THE DRAWINGS

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale. Like reference numbers and designations in the various drawings indicate like elements.

FIG. 2A is a graph of sound pressure level (SPL) versus frequency according to one example.

FIGS. 2B, 2C, 2D and 2E show examples of vibrational modes that correspond with the SPL peaks shown in FIG. 2A.

FIGS. 3A, 3B and 3C show examples of driving a segmented transducer stack like that of FIG. 2B in a variety of vibrational modes.

DETAILED DESCRIPTION

Figure 1A:
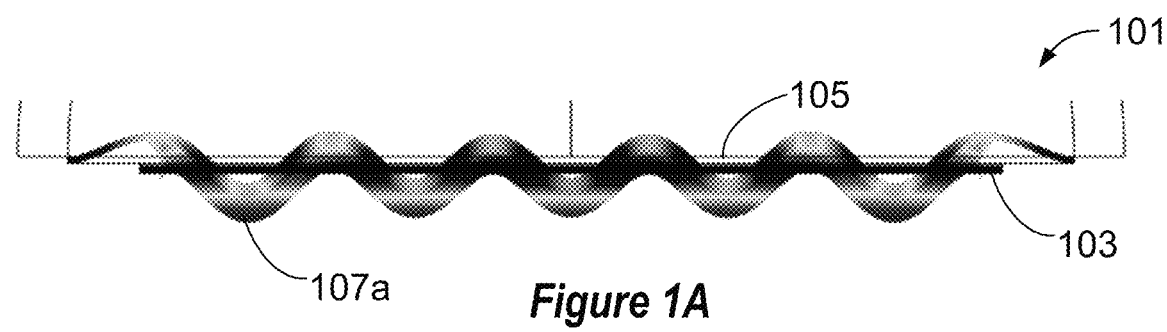
FIG. 1A shows a cross-section through a portion of a device according to one example.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes a segmented transducer array as disclosed herein. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, etc., Bluetooth® devices, personal data assistants (PDAs), wireless electronic mail receivers, handheld or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, automobiles, including but not limited to auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging, etc. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, steering wheels, door handles or other automobile parts, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The present inventors have developed novel devices, some of which use materials that have previously been deployed in ultrasonic sensor systems, such as piezoelectric layers (e.g., piezoelectric polymers). Some such devices are configured for gesture detection, e.g., ultrasonic gesture detection. Alternatively, or additionally, some such devices are configured for producing sounds in a frequency range that is audible to human beings, which is approximately 20 Hz to 20,000 Hz. Some such devices include in-display audio reproduction transducers, which may be referred to herein as in-display speakers or in-display loudspeakers. In the process of developing these novel devices, the present inventors have found that simply increasing the size of an in-display acoustic transducer does not necessarily result in a device that is capable of providing sufficiently high acoustic pressure for a satisfactory in-display loudspeaker.

The present inventors have developed various segmented transducer array designs. In some examples, a segmented transducer array may include a plurality of separate transducer segments. Each of the separate transducer segments may include a piezoelectric layer and a thin-film transistor (TFT) layer. Some such devices are configured for selective actuation of transducer array electrodes for boosting sound pressure level (SPL). In some implementations, transducer segments may have differing dimensions, in order to optimize for transmission or reception, and/or to optimize for transmitting or receiving different frequencies.

Particular implementations of the subject matter described in this disclosure may be implemented to realize one or more of the following potential advantages. Some disclosed devices include segmented transducer arrays that can provide sufficiently high acoustic pressure for a satisfactory in-display loudspeaker. Some such devices can provide satisfactory gesture detection functionality. According to some examples, two or more transmitter transducer segments with different center frequencies may be configured to operate simultaneously, in order to broaden the transmitting bandwidth. In some examples, two or more transmitter transducer segments may be configured to beamform, in order to improve the transmitted signal. According to some implementations, a control system may be configured to perform noise cancellation and/or beamforming based on receiver signals received from two or more receiver transducer segments.

FIG. 1A shows a cross-section through a portion of a device according to one example. According to this example, the apparatus 101 includes an unsegmented transducer stack 103 that extends across an area that includes most of an overlying display stack 105. More detailed examples of transducer stacks and display stacks are described below. The display stack 105 may, in some instances, include a cover. The sinusoid 107a represents oscillations of the combined unsegmented transducer stack 103 and the overlying display stack 105, produced by causing the unsegmented transducer stack 103 and the overlying display stack 105 to vibrate at a particular frequency. Such sinusoids also may be referred to herein as vibrational modes or oscillation modes.

Some of the inventors' initial efforts to develop in-display applications, including but not limited to in-display speaker applications, involved an assumption that a design similar to that of FIG. 1A, in which an unsegmented transducer stack extends across an area that corresponds with most or all of an overlying display stack, could be optimized to provide suitable functionality. However, the present inventors have found that simply increasing the size of an acoustic transducer stack to correspond with an entire display does not result in a device that is capable of providing sufficiently high acoustic pressure for a satisfactory in-display loudspeaker. Moreover, even optimizing the thicknesses of various layers of a transducer stack configured as shown in FIG. 1A did not yield a device capable of producing sufficiently high acoustic pressure for, e.g., a satisfactory in-display speaker.

Figure 1B:
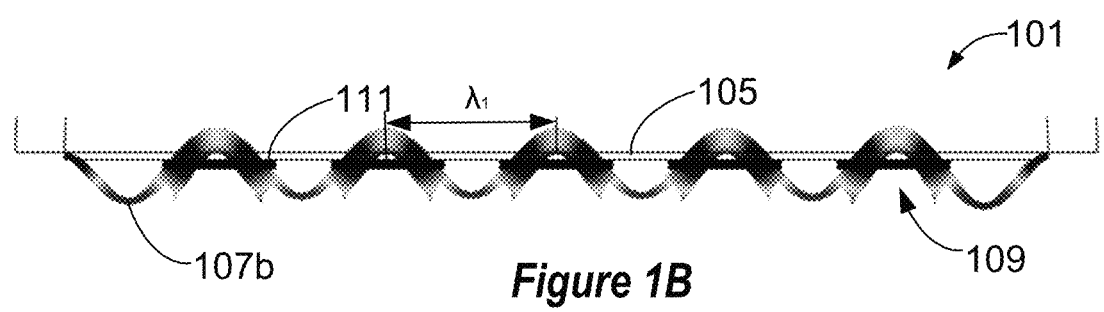
FIG. 1B shows a cross-section through a portion of an alternative device according to one example.

FIG. 1B shows a cross-section through a portion of an alternative device according to one example. According to this example, the apparatus 101 includes a segmented transducer stack 109 that extends across most of the overlying display stack 105. In this example, the segmented transducer stack 109 includes individual transducer segments 111. According to this implementation, a spacing between the transducer segments 111 (which may be transmitter transducer segments in some implementations) corresponds to a desired display stack and cover layer oscillation mode frequency. In FIG. 1B, the sinusoid 107b represents oscillations of the combined segmented transducer stack 109 and the overlying display stack 105. In this example, the spacing between the centers of the individual segments 111 corresponds to what will be referred to herein as a "mode wavelength" (shown as λi in FIG. 1B) of the sinusoid 107b. As used herein, the term "mode wavelength" is the distance between peaks of a display stack and cover layer oscillation mode. In this example, the desired display stack and cover layer oscillation mode frequency f corresponds to the mass, stiffness and dimensions of the structure, e.g., as described below.

Figure 1C:
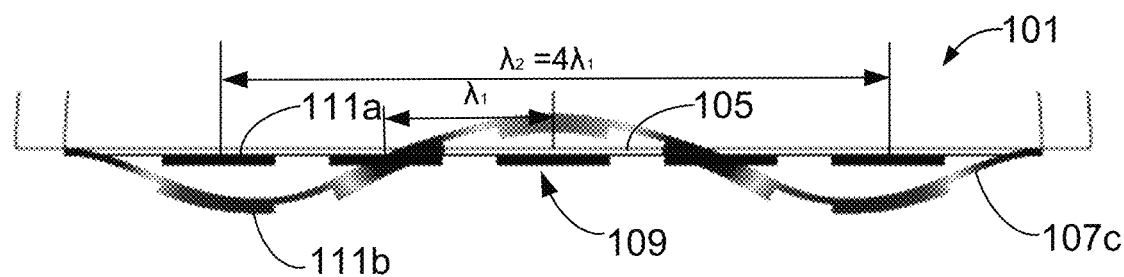
FIG. 1C shows a cross-section through a portion of the device of FIG. 1B according to another example.

FIG. 1C shows a cross-section through a portion of the device of FIG. 1B according to another example. According to this example, the apparatus 101 includes the same segmented transducer stack 109 that is shown in FIG. 1B. However, in this example the apparatus 101 is being controlled to oscillate at a different and lower frequency. In FIG. 1C, the sinusoid 107c represents oscillations of the combined segmented transducer stack 109 and the overlying display stack 105 at this different, lower frequency. According to this implementation, a spacing between at least a first plurality of the transmitter transducer segments is one quarter of a display stack and cover layer oscillation mode frequency that corresponds to the stiffness, mass and dimensions of the overall stack. In FIG. 1C, one example of a rest position of a transducer segment 111 is labeled 111a and one example of a displaced transducer segment 111 is labeled 111b. By comparing FIGS. 1B and 1C, one may observe that the same set of transducer segments 111 may be used to transmit or receive acoustic waves at different frequencies.

FIG. 2A is a graph of sound pressure level (SPL) versus frequency according to one example. In this example, the graph 200 corresponds to the SPL produced by an individual transducer segment. Each of the SPL peaks shown in FIG. 2A corresponds to a different resonant frequency. Each of the resonant frequencies has a particular mode of vibration.

Figure 2D:
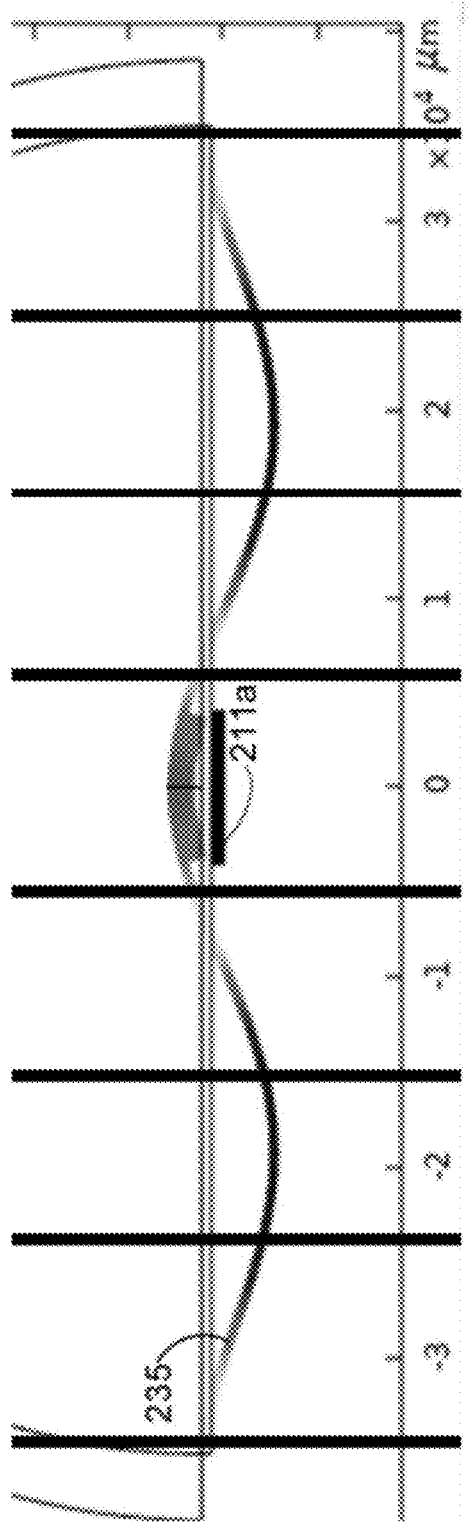

FIGS. 2B, 2C, 2D and 2E show examples of vibrational modes that correspond with the SPL peaks shown in FIG. 2A. According to these examples, the individual transducer segment 211a is being driven to produce vibrational modes in the display stack 205 corresponding to the SPL peaks in the graph of FIG. 2A. FIG. 2B shows a vibrational mode 225 that corresponds with the SPL peak 205 of FIG. 2A. The integers ranging from −3 to 3 in FIGS. 2C, 2D, 2E and 2F correspond with the spacing between peaks and adjacent troughs of the vibrational mode 225 shown in FIG. 2B. In this example, the spacing between peaks and adjacent troughs is $1 \times 10^4$ microns, indicating that the mode wavelength λa of the vibrational mode 225 is approximately $2 \times 10^4$ microns.

Figure 2E:
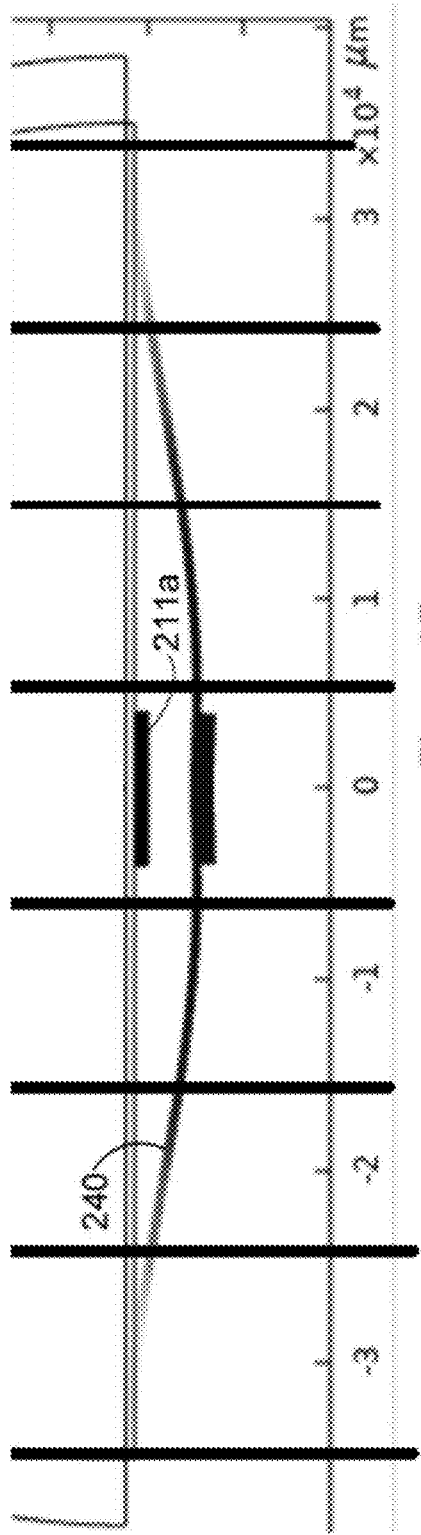

FIG. 2C shows a vibrational mode 230 that corresponds with the SPL peak 210 of FIG. 2A. FIG. 2D shows a vibrational mode 235 that corresponds with the SPL peak 215 of FIG. 2A. FIG. 2E shows a vibrational mode 240 that corresponds with the SPL peak 220 of FIG. 2A. One may observe that the mode wavelengths of the vibrational modes 230, 235 and 240 are increasingly longer than the mode wavelength $\lambda_a$ of the vibrational mode 225.

The frequency of oscillation of a structure (such as a display stack and cover layer) corresponds to the frequency of the acoustic waves that are excited into the air. This frequency of oscillation depends on the dimensions and material properties of the structure. Specifically, for a rectangular plate with uniform thickness that is clamped on all edges, this resonant frequency may be calculated as follows:

$$f = \frac{K_n}{2\pi} \sqrt{\frac{Dg}{wa^2}} \qquad \text{(Equation 1)}$$

In Equation 1, $K_n$ (n=1, 2, . . . ) represents a constant that depends on the mode of vibration and the ratio of the width and length of the plate, a represents the width of the plate, w represents the weight per unit area of the plate (which depends on dimensions and density of the material), g represents the acceleration of gravity and D represents the flexural rigidity of the plate. The flexural rigidity of the plate may be represented as follows:

$$D = \frac{Et^3}{12(1-v^2)} \qquad \text{(Equation 2)}$$

In Equation 2, E represents the Young's modulus of the material, t represents the thickness of the plate and v represents the Poisson's ratio of the material. Relevant material is described in Young, Warren C., Richard G. Budynas, and Ali M. Sadegh, *Roark's formulas for stress and strain*, (McGraw-Hill Education, 2012), which is hereby incorporated by reference.

According to some implementations, at least some transducer segments of a segmented transducer stack may be spaced according to one or more desired vibrational modes. When the segmented transducer stack is being used in a transmission mode, at least some transducer segments of a segmented transducer stack may be driven according to both the transducer segment spacing and the one or more desired vibrational modes.

FIGS. 3A, 3B and 3C show examples of driving a segmented transducer stack in a variety of vibrational modes. FIG. 3A shows an example of driving one example of a segmented transducer stack in "Configuration 3," which corresponds to the vibrational mode 225 shown in FIG. 2B. However, the vibrational mode 225 shown in FIG. 2B was caused by driving only the individual transducer segment 211a. In Configuration 3, adjacent transducer segments of the segmented transducer stack 309 are driven in opposite directions. For example, when the transducer segment 311a is being driven in the direction of the arrow 301a, the transducer segments 311b and 311c are being driven in the direction of the arrows 301b and 301c. As noted in FIG. 3A, driving the segmented transducer stack 309 according to Configuration 3 causes the segmented transducer stack 309 and the attached display stack 305 to produce an SPL at approximately 14 kHz that is approximately 10 dB higher than the SPL produced by the individual-transducer example of FIG. 2B.

FIG. 3B shows an example of driving the segmented transducer stack 309 in "Configuration 2," which corresponds to the vibrational mode 235 shown in FIG. 2D. However, the vibrational mode 225 shown in FIG. 2D was caused by driving only the individual transducer segment 211a. In Configuration 2, every other transducer segment is driven in opposite directions. For example, when the transducer segment 311a is being driven in the direction of the arrow 301f, the transducer segments 311d and 311e are being driven in the direction of the arrows 301d and 301e. In some examples of Configuration 2, the transducer segments 311b and 311c may not be driven. As noted in FIG. 3B, driving the segmented transducer stack 309 according to Configuration 2 produces a vibrational mode at approximately 3 kHz that causes substantially more displacement of the segmented transducer stack 309 and the attached display stack 305 than the displacement produced by the individual-transducer example of FIG. 2D.

FIG. 3C shows an example of driving the segmented transducer stack 309 in "Configuration 1," which corresponds to the vibrational mode 240 shown in FIG. 2E. In Configuration 1, at least some adjacent transducer segments are driven in the same direction. For example, when the transducer segment 311a is being driven in the direction of the arrow 301i, the transducer segments 311b and 311c are being driven in the direction of the arrows 301h and 301j. In some such examples, when the transducer segment 311a is being driven in the direction of the arrow 301i, the transducer segments 311d and 311e are being driven in the direction of the arrows 301g and 301k, respectively. As noted in FIG. 3C, driving the segmented transducer stack 309 according to Configuration 1 causes the segmented transducer stack 309 and the attached display stack 305 to produce an SPL at approximately 0.5 kHz that is approximately 10 dB higher than the SPL produced by the individual-transducer example of FIG. 2E at the same frequency.

Figure 4A:
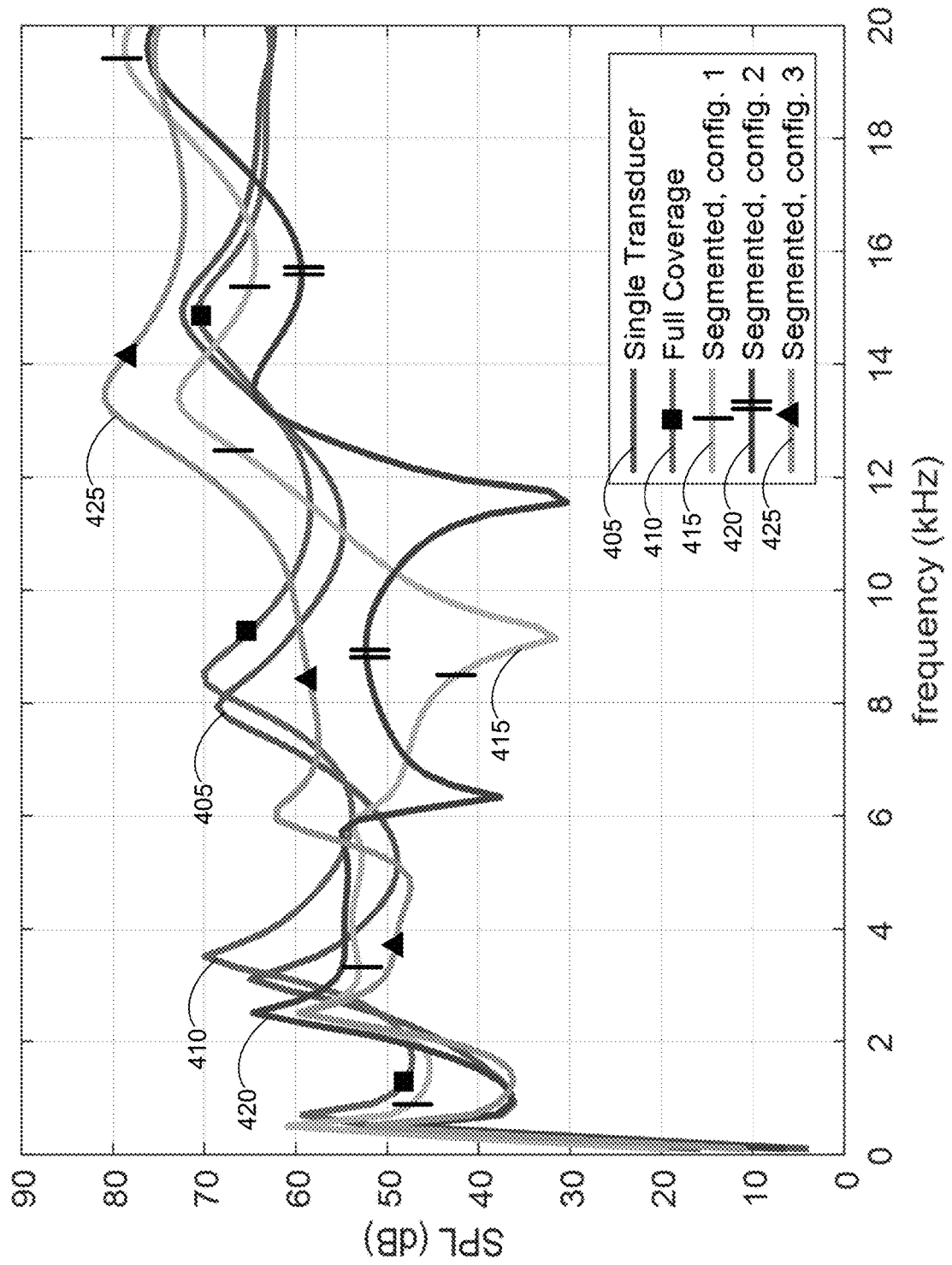
FIG. 4A shows graphs of SPL versus frequency for five examples of transducers and transducer arrays.

FIG. 4A shows graphs of SPL versus frequency for five examples of transducers and transducer arrays. All of the graphs shown in FIG. 4A correspond to the SPL produced by these five different types of transducers and transducer arrays while each type was attached to the same types and sizes of display stack and cover layer. Each of the graphs shown in FIG. 4A correspond to the SPL produced by transducers or transducer arrays causing display stack and cover layer oscillations in the indicated frequency range. In this example, the frequency range is zero to 20 kHz, which includes the audible spectrum for most human beings.

The curve 405 corresponds to the SPL produced by a single-transducer implementation, which is the single-transducer implementation that is described above with reference to FIGS. 2B-2E in this example. The curve 405 corresponds to the graph shown in FIG. 2A.

According to this example, the curve 410 corresponds to a "full coverage" unsegmented transducer, which extended across the entire display stack area. One might have expected that the much larger "full coverage" transducer would have produced significantly higher SPLs than the single-transducer implementation at most or all frequencies. However, this was not the case. Although the "full coverage" transducer produced higher SPLs than the single-transducer implementation in some frequency ranges (e.g., 1-2 kHz, 4-6 kHz and 9-12 kHz), the single-transducer implementation slightly outperformed the "full coverage" transducer in other frequency ranges (e.g., 2.5-3 kHz, 7-8 kHz and 14-18 kHz).

In this example, the curve 415 corresponds to the SPL produced by a segmented transducer that was being driven according to Configuration 1, one example of which is described above with reference to FIG. 3C. The segmented transducer driven according to Configuration 1 produced higher SPLs than the "full coverage" transducer or the single-transducer implementation in some frequency ranges (e.g., below about 700 Hz, 2-2.5 kHz, 11.5-14 kHz and 17-20 kHz), but the "full coverage" transducer and the single-transducer implementation outperformed the segmented transducer driven according to Configuration 1 in other frequency ranges.

According to this example, the curve 420 corresponds to the SPL produced by a segmented transducer that was being driven according to Configuration 2, one example of which is described above with reference to FIG. 3B. The segmented transducer driven according to Configuration 2 produced higher SPLs than the "full coverage" transducer or the single-transducer implementation in some frequency ranges (e.g., 2-2.5 kHz and 17.5-20 kHz), but the "full coverage" transducer and the single-transducer implementation outperformed the segmented transducer driven according to Configuration 2 in other frequency ranges.

In this example, the curve 425 corresponds to the SPL produced by a segmented transducer that was being driven according to Configuration 3, one example of which is described above with reference to FIG. 3A. The segmented transducer driven according to Configuration 3 produced higher SPLs than the "full coverage" transducer or the single-transducer implementation in some frequency ranges (e.g., 2-2.5 kHz, 5.5-6.5 kHz and 10.5-20 kHz), but the "full coverage" transducer and the single-transducer implementation outperformed the segmented transducer driven according to Configuration 3 in other frequency ranges.

Figure 4B:
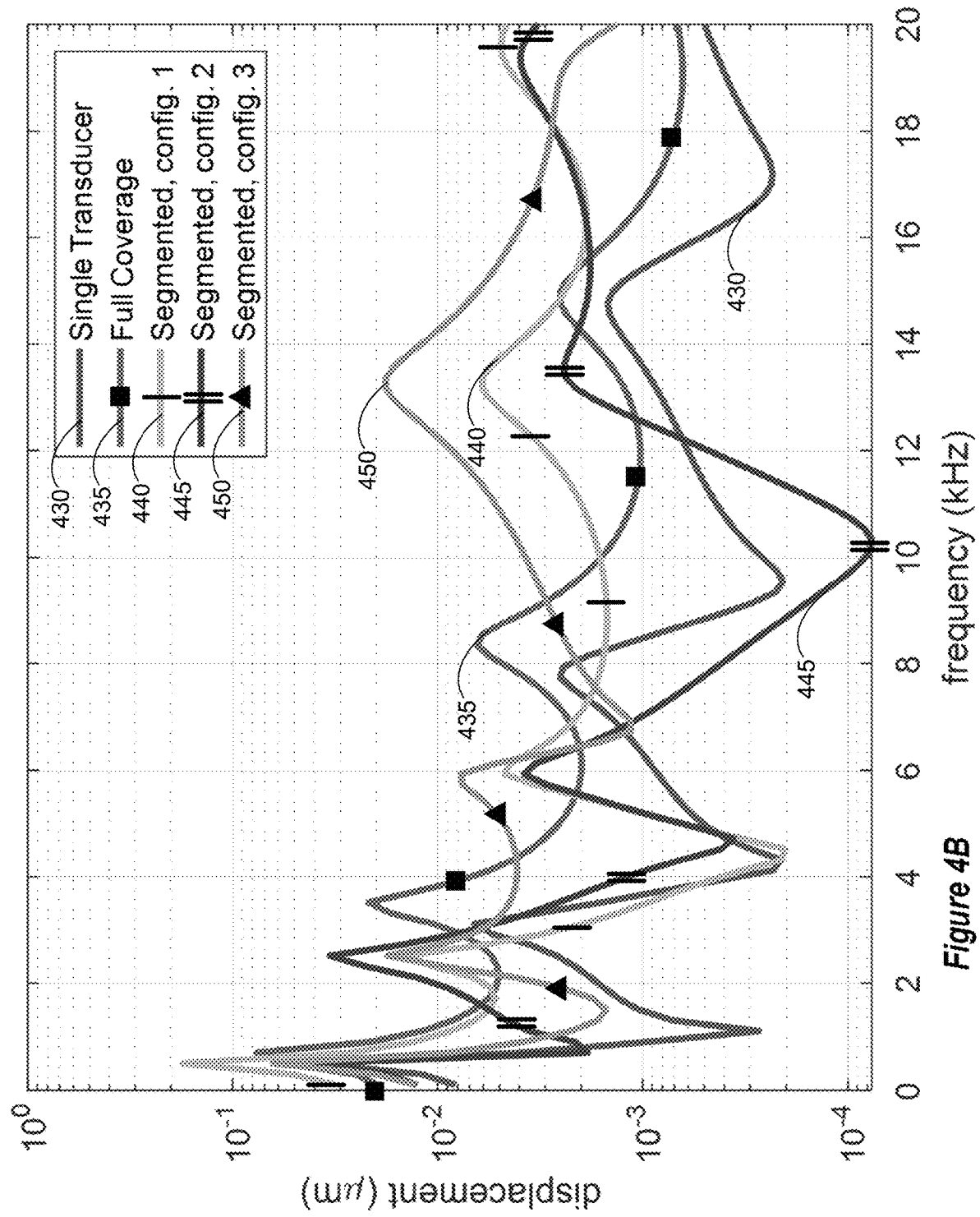
FIG. 4B shows graphs of displacement versus frequency for the same five examples of transducers and transducer arrays that are described above with reference to FIG. 4A.

FIG. 4B shows graphs of displacement versus frequency for the same five examples of transducers and transducer arrays that are described above with reference to FIG. 4A. All of the graphs shown in FIG. 4B correspond to the displacement produced by these five different types of transducers and transducer arrays while each type was attached to the same types and sizes of display stack and cover layer. In this example, the frequency range is zero to 20 kHz, which is the same range that is shown in FIG. 4A.

The curve 430 corresponds to the displacement produced by a single-transducer implementation, which is the single-transducer implementation that is described above with reference to FIGS. 2B-2E in this example. According to this example, the curve 435 corresponds to a "full coverage" unsegmented transducer. The "full coverage" transducer produced higher displacements than the single-transducer implementation at most or all frequencies. However, the difference between the displacement produced by the "full coverage" transducer implementation and the single-transducer implementation was not as great as one might have expected, particularly in some frequency ranges (e.g., around 3 kHz, 7-8 kHz and 14-15 kHz).

In this example, the curve 440 corresponds to the displacement produced by a segmented transducer that was being driven according to Configuration 1. The segmented transducer driven according to Configuration 1 produced higher displacements than the "full coverage" transducer in some frequency ranges (e.g., 2-2.5 kHz, around 6 kHz, 10-14.5 kHz and 16-20 kHz) and produced higher displacements than the single-transducer implementation in most frequency ranges.

According to this example, the curve 445 corresponds to the displacement produced by a segmented transducer that was being driven according to Configuration 2. The segmented transducer driven according to Configuration 2 produced higher displacements than the "full coverage" transducer in some frequency ranges (e.g., 1.5-3 kHz, around 6 kHz, 12.5-14.0 kHz and 16-20 kHz) and produced higher displacements than the single-transducer implementation in most frequency ranges.

In this example, the curve 450 corresponds to the displacement produced by a segmented transducer that was being driven according to Configuration 3. The segmented transducer driven according to Configuration 3 produced higher displacements than the "full coverage" transducer in some frequency ranges (e.g., 2-2.5 kHz, 4.5-6.5 kHz and 9.5-20 kHz) and produced higher displacements than the single-transducer implementation in most frequency ranges.

In view of data such as that summarized in FIGS. 4A and 4B, as well as additional data corresponding to higher frequency ranges, the inventors have determined that improved in-display loudspeaker performance and/or gesture detection performance may be provided via an apparatus that includes a display stack, a cover layer proximate a first side of the display stack and a segmented transducer array proximate a second side of the display stack. In some implementations, the apparatus may include a control system that is configured to cause the segmented transducer array, the display stack and the cover layer to vibrate in a plurality of vibrational modes. In some implementations, each of the vibrational modes may correspond with desired one or more desired frequency ranges.

Figure 5:
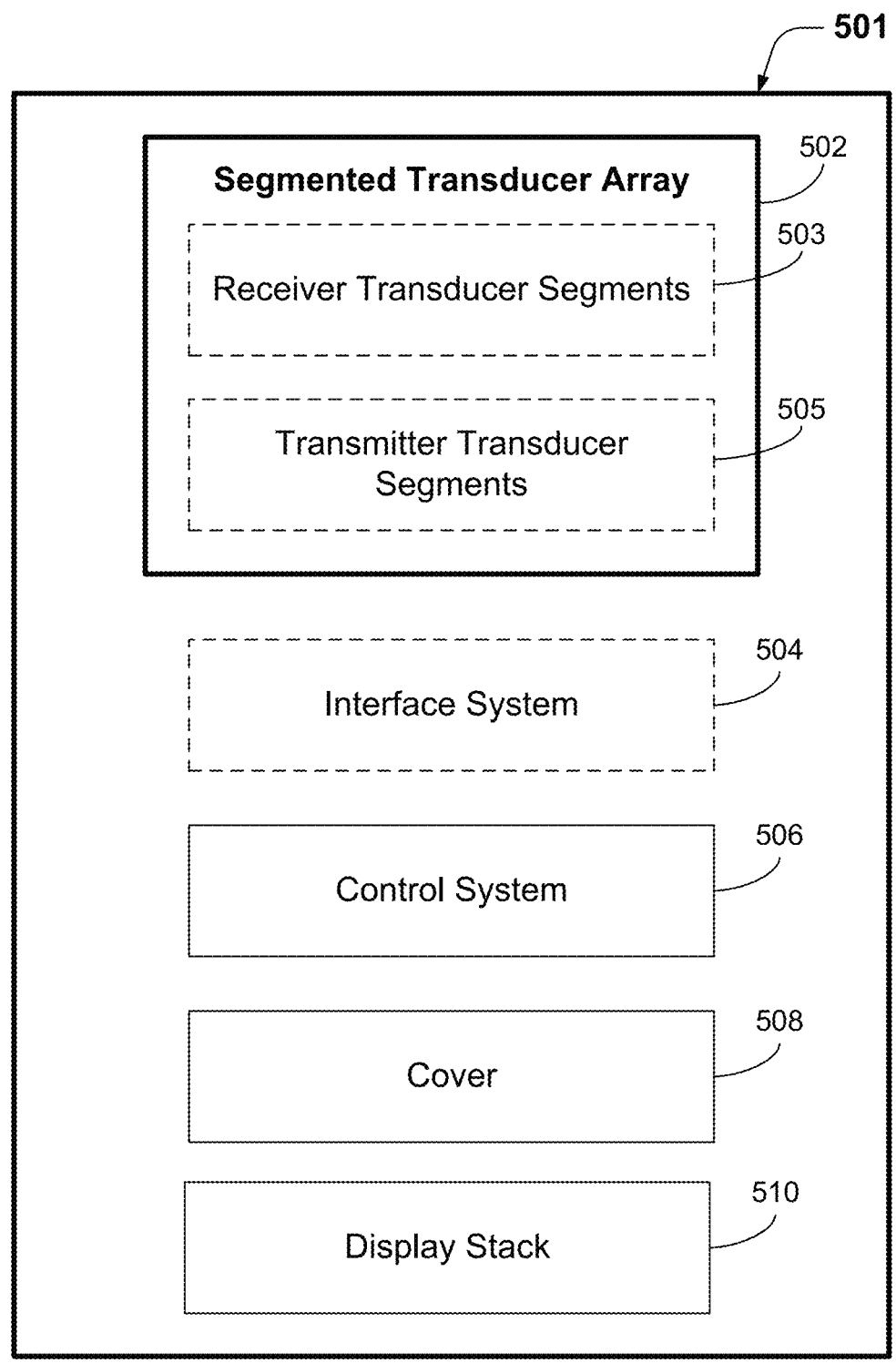
FIG. 5 is a block diagram that shows example components of an apparatus according to some disclosed implementations.

FIG. 5 is a block diagram that shows example components of an apparatus according to some disclosed implementations. In this example, the apparatus 501 includes a segmented transducer array 502, a display stack 510 and a cover 508. In some implementations, the apparatus 501 may include a control system 506. In some examples, the apparatus 501 may include an interface system 504. As with other disclosed implementations, the types, numbers and arrangements of elements shown in FIG. 5 are merely presented by way of example.

In some examples, as suggested by the dashed lines within the segmented transducer array 502, the segmented transducer array 502 may include a receiver transducer segments 503 and transmitter transducer segments 505. However, various examples of segmented transducer arrays are disclosed herein, some of which may include separate transmitter and receiver transducer segments and some of which may not. Although shown as separate elements in FIG. 5, in some implementations at least some transducer segments of the segmented transducer array may be configured for both transmitting and receiving.

In some implementations, each of the transducer segments may include a piezoelectric layer and a thin-film transistor (TFT) layer. The piezoelectric layer may, for example, include a layer of polyvinylidene fluoride PVDF polymer and/or a layer of polyvinylidene fluoride-trifluoro-ethylene (PVDF-TrFE) copolymer. In some implementations, the piezoelectric layer may include other piezoelectric materials, such as aluminum nitride (AlN) or lead zirconate titanate (PZT). The segmented transducer array 502 may, in some examples, include an array of ultrasonic transducer segments.

The control system 506 may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof. According to some examples, the control system 506 may include a dedicated component for controlling the segmented transducer array 502. The control system 506 also may include (and/or be configured for communication with) one or more memory devices, such as one or more random access memory (RAM) devices, read-only memory (ROM) devices, etc. Accordingly, the apparatus 501 may have a memory system that includes one or more memory devices, though the memory system is not shown in FIG. 5. The control system 506 may be configured for receiving and processing data from at least a portion of the segmented transducer array 502, e.g., from the receiver transducer segments 503. If the apparatus 501 includes transmitter transducer segments 505, the control system 506 may be configured for controlling the transducer segments 505. In some implementations, functionality of the control system 506 may be partitioned between one or more controllers or processors, such as between a dedicated sensor controller and an applications processor of a mobile device.

Some implementations of the apparatus 501 may include an interface system 504. In some examples, the interface system 504 may include a wireless interface system. In some implementations, the interface system 504 may include a user interface system, one or more network interfaces, one or more interfaces between the control system 506 and a memory system, and/or one or more interfaces between the control system 506 and one or more external device interfaces (e.g., ports or applications processors).

The interface system 504 may be configured to provide communication (which may include wired or wireless communication, electrical communication, radio communication, etc.) between components of the apparatus 501. In some such examples, the interface system 504 may be configured to provide communication between the control system 506 and the segmented transducer array 502. According to some such examples, the interface system 504 may couple at least a portion of the control system 506 to the segmented transducer array 502, e.g., via electrically conducting material such as conductive metal wires or traces. If the apparatus 501 includes separate receiver transducer segments 503 and transmitter transducer segments 505, the interface system 504 may be configured to provide separate communications between the control system 506 and the receiver transducer segments 503 and transmitter transducer segments 505.

According to some examples, the interface system 504 may be configured to provide communication between the apparatus 501 and other devices and/or human beings. In some such examples, the interface system 504 may include one or more user interfaces. The interface system 504 may, in some examples, include one or more network interfaces and/or one or more external device interfaces (such as one or more universal serial bus (USB) interfaces or a serial peripheral interface (SPI)). In some implementations, the apparatus 501 may include a memory system. The interface system 504 may, in some examples, include at least one interface between the control system 506 and a memory system.

According to some examples, the apparatus 501 may include a cover 508. The cover 508 may or may not be optically transparent, depending on the particular implementation. The cover 508 may be formed of any appropriate material, such as glass, a hard plastic, metal, etc. If at least a portion of the cover 508 overlies a display, that portion of the cover 508 is preferably formed of optically transparent material, e.g., material that is transparent to electromagnetic waves in the spectrum that is visible to humans.

In some implementations, the apparatus 501 includes a display stack 510. For example, the apparatus 501 may include layers of a display, which layers may be referred to herein as a "display stack." In some examples, the display stack may be, or may include, a light-emitting diode (LED) display, such as an organic light-emitting diode (OLED) display.

The apparatus 501 may be deployed in various devices and/or systems. In some examples, a mobile device (e.g., a cell phone or other portable display device) may include the apparatus 501. In some such examples, the control system 506 may be configured for controlling the apparatus 501 to provide in-display loudspeaker functionality and/or gesture detection functionality. In some such examples, the control system may be configured for controlling the mobile device based, at least in part, on gesture detection functionality provided by the apparatus 501.

In some implementations an Internet of things (IoT) device may include the apparatus 501. For example, in some such implementations a device intended for use in a home, such as a remote control device (such as a remote control device for a smart television), a stove, an oven, a refrigerator, a stove, a coffee maker, an alarm system, a door lock, a mail/parcel box lock, a thermostat, etc., may include the apparatus 501. In some such examples, the control system 506 may be configured for controlling the apparatus 501 to provide in-display loudspeaker functionality and/or gesture detection functionality. In some such examples, the control system may be configured for controlling the IoT device based, at least in part, on gesture detection functionality provided by the apparatus 501.

In alternative implementations, an automobile or a portion thereof (including but not limited to a partially or fully autonomous automobile), a partially or fully autonomous delivery vehicle or a portion thereof, a drone, or another device typically used outside of the home may include the apparatus 501. In some such examples, the control system 506 may be configured for controlling the apparatus 501 to provide in-display loudspeaker functionality and/or gesture detection functionality. In some such examples, the control system may be configured for controlling the vehicle, the drone, etc., based at least in part on gesture detection functionality provided by the apparatus 501.

In some examples, including but not limited to many IoT implementations, there may be a metal, plastic, ceramic or polymer layer between an outer surface of the apparatus 501, or an outer surface of a device that includes the apparatus 501. In such implementations, the acoustic waves transmitted towards, and reflected from, a finger or other target may need to pass through the metal, plastic, ceramic or polymer layer. Ultrasound and other acoustic waves can be successfully transmitted through e.g., a metal layer, whereas some other types of waves (e.g., light waves) cannot. Similarly, ultrasound and other acoustic waves can be successfully transmitted through an optically opaque plastic, ceramic or polymer layer, whereas some other types of waves, such as light waves, cannot. This feature is another potential advantage of some disclosed implementations, as compared to devices that rely upon optical or capacitive sensors.

In some examples, the cover 508 may be proximate (e.g., adjacent to, within one or two layers of, etc.) a first side of the display stack 510. In some examples, the cover 508 may be attached to the first side of the display stack 510, e.g., via an adhesive layer. The first side may, for example, be a side facing the outside of the apparatus 501. In some such examples, the segmented transducer array 502 may be proximate a second side of the display stack. The second side may, for example, be a side facing the inside of the apparatus 501. According to some such examples, the segmented transducer array 502 may include a plurality of separate transducer segments. The separate transducer segments may, in some instances, include separate transmitter transducer segments 505 and receiver transducer segments 503. However, in other examples (such as some in-display loudspeaker implementations), the separate transducer segments may only include separate transmitter transducer segments 505. In still other examples, at least some transducer segments may be configured as both transmitter and receiver transducer segments.

Each of the separate transducer segments may, in some implementations, include a piezoelectric layer and a thin-film transistor (TFT) layer. According to some examples, a spacing between at least a first plurality of the transmitter transducer segments 505 may correspond to a display stack and cover layer oscillation mode frequency. The display stack and cover layer oscillation mode frequency, in some examples, are in the range from 20 Hz to 20 kHz. In some such examples, the control system 506 may be configured for controlling at least the first plurality of the transmitter transducer segments 505 to reproduce audio signals by causing the display stack and the cover layer to oscillate at frequencies in the range from 20 Hz to 20 kHz.

According to some examples, a distance between centers of the first plurality of the transmitter transducer segments 505 may equal a mode wavelength corresponding to the display stack and cover layer oscillation mode frequency. One such example is shown in FIG. 1B and is described above.

In some implementations, a distance between centers of the first plurality of the transmitter transducer segments 505 may equal half of the mode wavelength corresponding to the display stack and cover layer oscillation mode frequency. One such example is shown in FIG. 3A and is described above.

According to some implementations, a distance between centers of the first plurality of the transmitter transducer segments 505 may equal a quarter of the mode wavelength corresponding to the display stack and cover layer oscillation mode frequency. One such example is shown in FIG. 3B and is described above. In some implementations, a distance between centers of the first plurality of the transmitter transducer segments 505 may equal an eighth of the mode wavelength corresponding to the display stack and cover layer oscillation mode frequency. In other instances, a distance between centers of the first plurality of the transmitter transducer segments 505 may equal a different fraction of the mode wavelength corresponding to the display stack and cover layer oscillation mode frequency.

Figure 6:
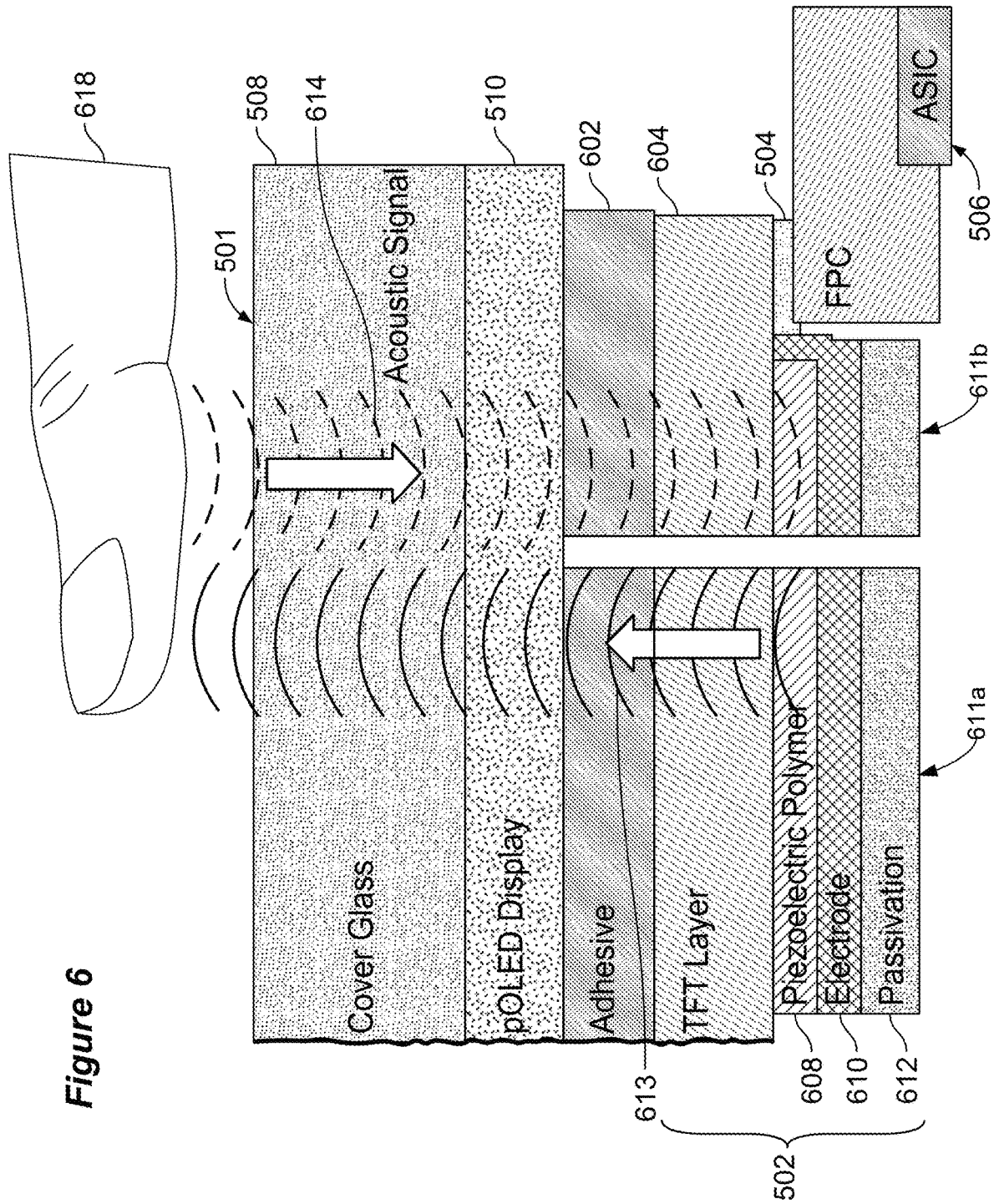
FIG. 6 shows a cross-section through a portion of the apparatus of FIG. 5 according to one example.

In some implementations, the control system 506 may be configured to drive one or more transmitter transducer segments of the first plurality of the transmitter transducer segments 505 transmitter transducer segments 505 by causing a voltage to be applied to an electrode of each of the one or more transmitter transducer segments. In some such examples, each of the electrodes may be adjacent to a corresponding piezoelectric layer of a transmitter transducer segment, e.g., as shown in FIG. 6 and described below. According to some implementations, the control system 506 may be configured to drive the transmitter transducer segments 505 in a high-order mode wherein adjacent transmitter transducer segments of the first plurality of the transmitter transducer segments are driven in opposite directions. In some implementations, the control system 506 may be configured to drive the transmitter transducer segments 505 in a medium-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

According to some examples, the control system 506 may be configured to drive the transmitter transducer segments 505 in a low-order mode wherein, at a time during which a first transmitter transducer segment of the first plurality of the transmitter transducer segments 505 is driven in a first direction, a second transmitter transducer segment of the first plurality of the transmitter transducer segments 505 that is adjacent to the first transmitter transducer segment is driven in the first direction. In some such examples, a third transducer segment of the first plurality of the transmitter transducer segments 505 that is adjacent to the second transmitter transducer segment is driven in the first direction.

In some implementations, the control system 506 may be configured to perform noise cancellation based on receiver signals received from two or more receiver transducer segments 503. Some examples are described below.

According to some examples, a spacing between at least a second plurality of the transmitter transducer segments 505 corresponds to a display stack and cover layer oscillation mode for a frequency in a range from 15 KHz to 200 KHz. In some examples, a spacing between at least one plurality of the transmitter transducer segments 505 may correspond to a display stack and cover layer oscillation mode frequency in the range from 20 kHz-400 kHz. According to some examples, the control system 506 may be configured for controlling at least one plurality of the transmitter transducer segments 505 to cause the display stack and the cover layer to oscillate at frequencies in the range from 15 kHz-400 kHz. In some implementations, the control system 506 may be configured to drive the transmitter transducer segments and to obtain receiver signals from the receiver transducer segments 503. In some such implementations, the control system 506 may be configured for detecting a target object location and/or gesture based, at least in part, on ultrasonic signals received via one or more of the receiver transducer segments 503.

FIG. 6 shows a cross-section through a portion of the apparatus of FIG. 5 according to one example. According to this implementation, the apparatus 501 includes a segmented transducer array 502. Here, the segmented transducer array 502 includes a piezoelectric layer 608, an electrode layer 610 on one side of the piezoelectric layer 608 and a TFT layer 604 on a second and opposing side of the piezoelectric layer 608. In this implementation, the piezoelectric layer 608 includes one or more piezoelectric polymers.

According to this example, the electrode layer 610 resides between a passivation layer 612 and the piezoelectric layer 608. In some examples, passivation layer 612 may include an adhesive, such as an epoxy film, a polymer layer (such as a polyethylene terephthalate (PET) layer), etc.

In this example the thin-film transistor (TFT) layer 604 includes a TFT substrate and circuitry. The TFT layer 604 may be a type of metal-oxide-semiconductor field-effect transistor (MOSFET) made by depositing thin films of an active semiconductor layer as well as a dielectric layer and metallic contacts over a TFT substrate. In some examples, the TFT substrate may be a non-conductive material such as glass.

In this example, the apparatus 501 includes a display stack 510, which is an OLED display stack in this instance. Here, the display stack 510 is attached to the TFT layer 604 via an adhesive layer 602. According to this example, the apparatus 501 includes a cover 508 on an outer surface of the display stack 510. The cover 508 is a cover glass in this instance.

In this implementation, the segmented transducer array 502 includes at least one transmitter segment 611*a* and at least one receiver segment 611*b*. The receiver segment 611*b* may, for example, be one of a plurality of receiver transducer segments 503 and the transmitter segment 611*a* may be one of a plurality of transmitter transducer segments 505. According to this implementation, the TFT layer 604 and the electrode layer 610 of both the transmitter segment 611*a* and the receiver segment 611*b* are electrically coupled to at least a portion of the control system 506 via a portion of the interface system 504, which includes electrically conducting material and a flexible printed circuit (FPC) in this instance. According to this example, the electrical connections between the control system 506 and the transmitter segment 611*a* are out of the plane of the cross-section and are therefore not shown in FIG. 6.

In this example, the control system 506 is configured to control the transmitter segment 611*a* to transmit one or more acoustic waves 613 by sending one or more electrical signals via the electrode layer 610 of the transmitter segment 611*a*. According to this example, the acoustic wave(s) 613 are transmitted through the TFT layer 604, the display 110 and the cover glass 108. According to this example, reflections 614 of the acoustic wave(s) 613 are caused by acoustic impedance contrast between the outer surface of the target object 618 (which is a finger in this instance) and the air outside of the apparatus 501. As used herein, the term "finger" may refer to any digit, including a thumb. In this example, the reflections 614 cause the piezoelectric layer 608 of the receiver segment 611*b* to transmit one or more electrical signals to the control system 506 via the electrode layer 610.

According to some implementations, one or more dimensions of a transducer segment may be tuned or optimized, e.g., for transmission or for reception. In some examples, a transmitter segment thickness of each of the first plurality of the transmitter transducer segments 505 may be different from a receiver segment thickness of each of a first plurality of the receiver transducer segments 503. In some such examples, a receiver segment piezoelectric layer thickness of each of the first plurality of the receiver transducer segments 503 may be greater than a transmitter segment piezoelectric layer thickness of each of the first plurality of the transmitter transducer segments 505.

According to some implementations, a first subset of the separate transducer segments may have a first segment width and a second subset of the separate transducer segments may have a second segment width. In some implementations, one or more dimensions of a transducer segment may be tuned or optimized for transmission or for reception at one or more frequencies or in one or more frequency ranges.

Figure 7:
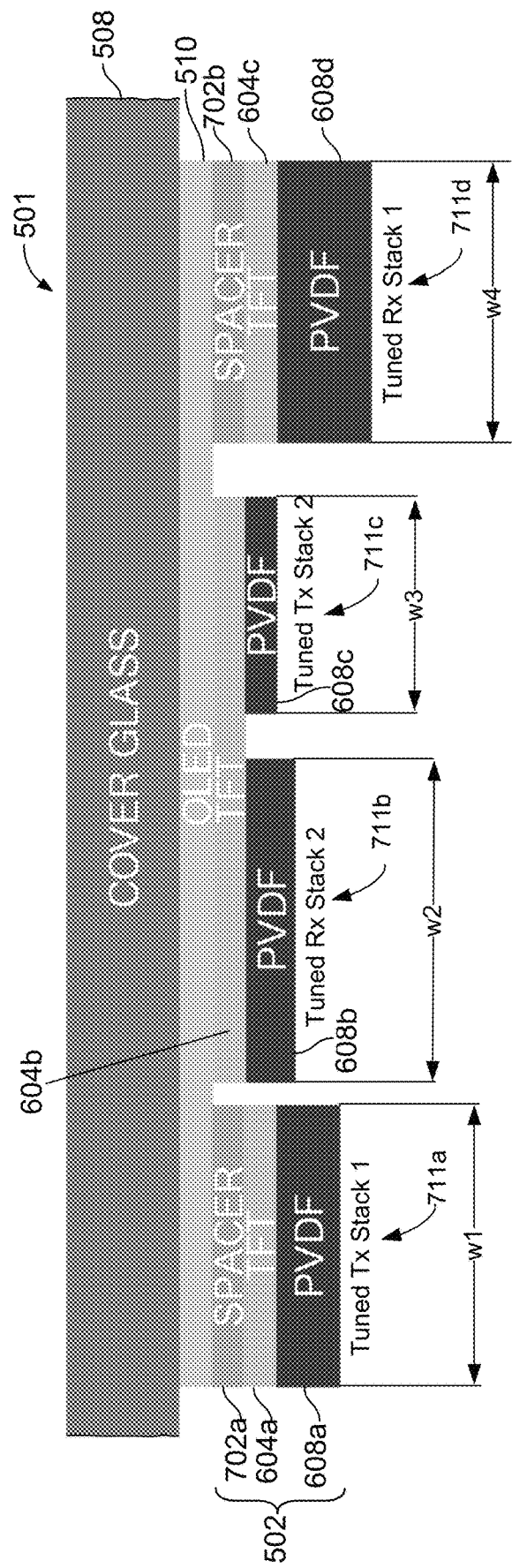
FIG. 7 shows a cross-section through a portion of the apparatus of FIG. 5 according to another example.

FIG. 7 shows a cross-section through a portion of the apparatus of FIG. 5 according to another example. As with other disclosed implementations, the numbers, types and arrangements of elements depicted in FIG. 7 are only shown by way of example. Other implementations may have different numbers, types and/or arrangements of elements.

In this example, the apparatus 501 includes a display stack 510, which is an OLED display stack in this instance. According to this example, the apparatus 501 includes a cover 508 on an outer surface of the display stack 510. The cover 508 is a cover glass in this instance.

According to this implementation, the apparatus 501 includes a segmented transducer array 502 that includes transmitter transducer segments 711a and 711c, as well as receiver transducer segments 711b and 711d. The transducer segments 711a-711d may, for example, each be instances of a plurality of identical or substantially identical (e.g., identical within plus or minus 5%, within plus or minus 10%, etc.) transducer segments that are included within a complete version of the apparatus 501.

In this example, each of the segments 711a-711d includes a piezoelectric layer segment. The segments 711a-711d include piezoelectric layer segments 608a-608d, respectively. According to this implementation, the piezoelectric layer segments 608a-608d include PVDF, but in other implementations the piezoelectric layer segments may include one or more other types of piezoelectric material. The present inventors have determined that a PVDF thicknesses that is optimal for transmission may not be optimal for reception. For example, a relatively thicker PVDF is generally desirable for receiver transducer segments. Accordingly, the receiver transducer segments 711b and 711d have relatively thicker piezoelectric layer segments than the transmitter transducer segments 711a and 711c. In this example, the thinnest piezoelectric layer segment is piezoelectric layer segment 608c and the thickest piezoelectric layer segment is piezoelectric layer segment 608d. In some examples, the thicknesses of the piezoelectric layer segments may range from approximately 10 microns to approximately 30 microns. However, in other implementations the thicknesses of the piezoelectric layer segments may range from a thickness that is greater than or less than 10 microns to a thickness that is greater than or less than 30 microns.

In this example, each of the segments 711a-711d includes a TFT layer segment. The segments 711a and 711d include TFT layer segments 604a and 604c, whereas segments 711b and 711c both include portions of the TFT layer segment 604b. The present inventors have determined that in many instances a transducer segment having a relatively thinner TFT layer (e.g., in the range of 50 to 100 microns) provides relatively superior performance to a transducer segment having a relatively thicker TFT layer (e.g., in the range of 200 to 250 microns).

According to this example, the segment 711a has a width w1, the segment 711b has a width w2, the segment 711c has a width w3 and the segment 711d has a width w4. The present inventors have determined that different sizes (e.g., the widths) of transducer segments can produce different frequency responses (e.g., different SPL peaks and troughs in a graph of SPL versus frequency). Transducer segments having different sizes (e.g., having widths in a range from 5 to 70 microns) may advantageously be integrated into a single device in order to provide satisfactory performance across a frequency range of interest.

According to this example, the transducer segments 711a and 711d include spacer layer segments 702a and 702b, respectively. In this implementation, the transducer segments 711b and 711c do not include spacer layer segments, while in some other implementations the transducer segments 711b and 711c may include spacer layer segments. The present inventors have determined that the effect of spacer layer thickness in a transducer segment also depends on the relative width of the transducer segment. In some instances, a narrow transducer segment (e.g., having a width of 20 microns or less) having a relatively thinner spacer layer or no spacer layer (e.g., a spacer layer in the range of zero to 100 microns) may provide relatively better performance (e.g., higher SPL). In some instances, a wider transducer segment (e.g., having a width of 60 microns or more) having a relatively thicker spacer layer (e.g., a spacer layer in the range of 200 to 400 microns) may provide relatively better performance (e.g., higher SPL).

Figure 8:
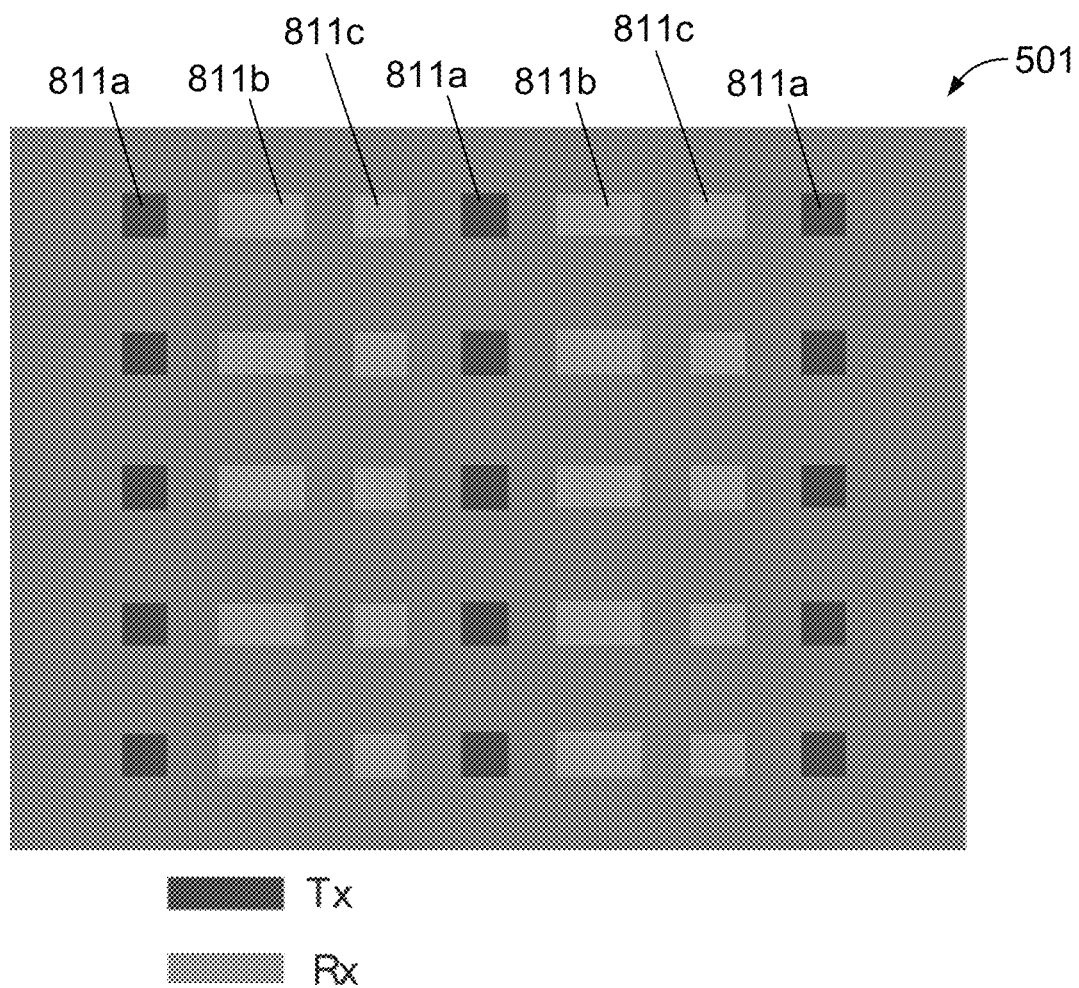
FIG. 8 shows another example of the apparatus of FIG. 5.

FIG. 8 shows another example of the apparatus of FIG. 5. As with other disclosed implementations, the numbers, types and arrangements of elements depicted in FIG. 8 are only shown by way of example. Other implementations may have different numbers, types and/or arrangements of elements.

In this example, the apparatus 501 includes three types of transducer segments. Here, the transducer segments 811a are transmitter transducer segments, whereas the transducer segments 811b and 811c are receiver transducer segments. According to this example, transducer segments 811a-811c include a range of sizes, in order to provide satisfactory performance across a range of frequencies.

Figure 9:
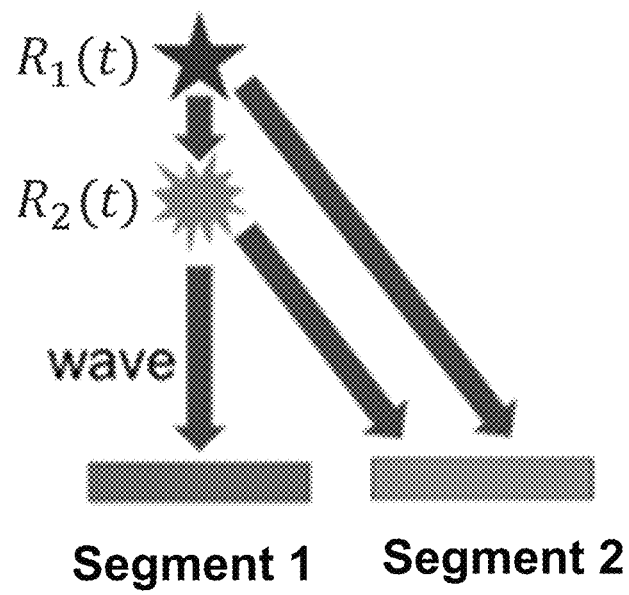
FIG. 9 shows an example of noise/interference cancellation in a segmented transducer array.

FIG. 9 shows an example of noise/interference cancellation in a segmented transducer array. According to some implementations, a control system (e.g., the control system 506 of the apparatus 501) may be configured to provide noise/interference cancellation functionality by exploiting the redundancy of signals from two or more neighboring (e.g., adjacent) receiver transducer segments. Although only two receiver transducer segments are shown in FIG. 9 for the sake of simplicity, the noise/interference-cancellation concepts that are described with reference to FIG. 9 may be extended, and potentially made more effective, by extending them to implementations in which more than two receiver transducer segments are used for noise/interference cancellation.

In this example, $R_1(t)$ and $R_2(t)$ represent two acoustic sources as functions of time. According to this example, $S_1(t)$ represents the signal received by transducer segment 1 from $R_1(t)$ and $R_2(t)$, and $a_1$ and $b_1$ represent constants. In this example, $S_2(t)$ represents the signal received by transducer segment 2 from $R_1(t)$ and $R_2(t)$, and $a_2$ and $b_2$ represent constants. In this example, transducer segment 1 is adjacent to transducer segment 2.

In order to solve for $R_1(t)$ and $R_2(t)$ from $S_1(t)$ and $S_2(t)$, some implementations involve estimating $a_1$, $a_2$, $b_1$ and $b_2$ for different scenarios. The relationships between $R_1(t)$, $R_2(t)$, $S_1(t)$, $S_2(t)$, $a_1$, $a_2$, $b_1$ and $b_2$ may be expressed as follows:

$$[R_1(t), R_2(t)]^T = \begin{bmatrix} a_1 & b_1 \\ a_2 & b_2 \end{bmatrix}^{-1} [S_1(t), S_2(t)]^T \quad \text{(Equation 3)}$$

In one example case, $R_2(t)$ and $R_1(t)$ are independent signals. In one example, if $R_1(t)$ is the desired signal, then $R_2(t)$ is the interference signal. In this case, the relationships between $a_1$, $a_2$, $b_1$ and $b_2$ in the frequency domain may be expressed as follows:

$$a_2 = \exp(-\omega\tau_1)a_1 \quad \text{(Equation 4)}$$

$$b_2 = \exp(-\omega\tau_2)b_1 \quad \text{(Equation 5)}$$

In Equation 4, $\tau_1$ represents a first delay time, which is the difference between the times at which sound from $R_1(t)$ is received by transducer segment 1 and transducer segment 2. In Equation 5, $\tau_2$ represents a second delay time, which is the difference between the times at which sound from $R_2(t)$ is received by transducer segment 1 and transducer segment 2. According to some implementations, a control system may be configured to estimate $\tau_1$ and $\tau_2$ by making a cross-correlation between $S_1(t)$ and $S_2(t)$.

In another example case, $R_1(t)$ and $R_2(t)$ are not independent signals. Instead, in one such example, $R_2(t)$ is a reflection of $R_1(t)$. In this case, the relationships between $R_1(t)$ and $R_2(t)$ may be expressed as follows:

$$R_2(t) = \epsilon \exp(-\omega\tau_d)R_1(t) \quad \text{(Equation 6)}$$

In Equation 6, $\tau_d$ represents the delay time between $R_1(t)$ and $R_2(t)$. Accordingly, the relationships between $R_1(t)$, $S_1(t)$ and $S_2(t)$ may be expressed as follows:

$$S_1(t) = cR_1(t) \quad \text{(Equation 7)}$$

$$S_2(t) = rcR_1(t) \quad \text{(Equation 8)}$$

In Equations 7 and 8, r and c represent different complex constant factors. According to some examples, a control system may be configured to estimate r from the frequency domain at a frequency $f_0$ as follows:

$$r = S_2(f_0)/S_1(f_0) \quad \text{(Equation 9)}$$

According to some implementations, after estimating r a control system may be configured to estimate c as follows:

$$cR_1(f) = \sqrt{\left|\frac{S_1(f)S_2(f)}{r}\right|} \exp\left\{\frac{j}{2} < \left[\frac{S_1(f)S_2(f)}{r}\right]\right\} \quad \text{(Equation 10)}$$

The methods above may be extended to implementations that involve three or more receiver transducer segments. Other implementations may involve different noise cancellation methods, such as those described in Li Cheng et al., "DOA Estimation for Highly Correlated and Coherent Multipath Signals with Ultralow SNRs," in *International Journal of Antennas and Propagation*, vol. 2019, Article ID 2837315 (2019), or those described in H. Almansouri et al., "Model-Based Iterative Reconstruction for One-Sided Ultrasonic Nondestructive Evaluation," in *IEEE Transactions on Computational Imaging*, vol. 5, no. 1, pp. 150-164 (March 2019), both of which are hereby incorporated by reference.

In some implementations, the apparatus 501 may be configured for transmit-side or receive-side beamforming. For example, in some implementations the control system 506 may be configured to control a plurality of transmitter transducer segments for transmit-side beamforming. Alternatively, or additionally, in some implementations the control system 506 may be configured to control a plurality of receiver transducer segments for receive-side beamforming. Beamforming can result in noise cancellation and resulting increases in signal-to-noise ratio of signals transmitted or received by an array of transducer segments.

FIGS. 10A, 10B, 10C and 10D provide examples of receive-side beamforming according to some implementations. As with other disclosed implementations, the scale, numbers, arrangements and types of the elements shown in FIGS. 10A, 10B, 10C and 10D are merely made for illustrative purposes.

Figure 10A:
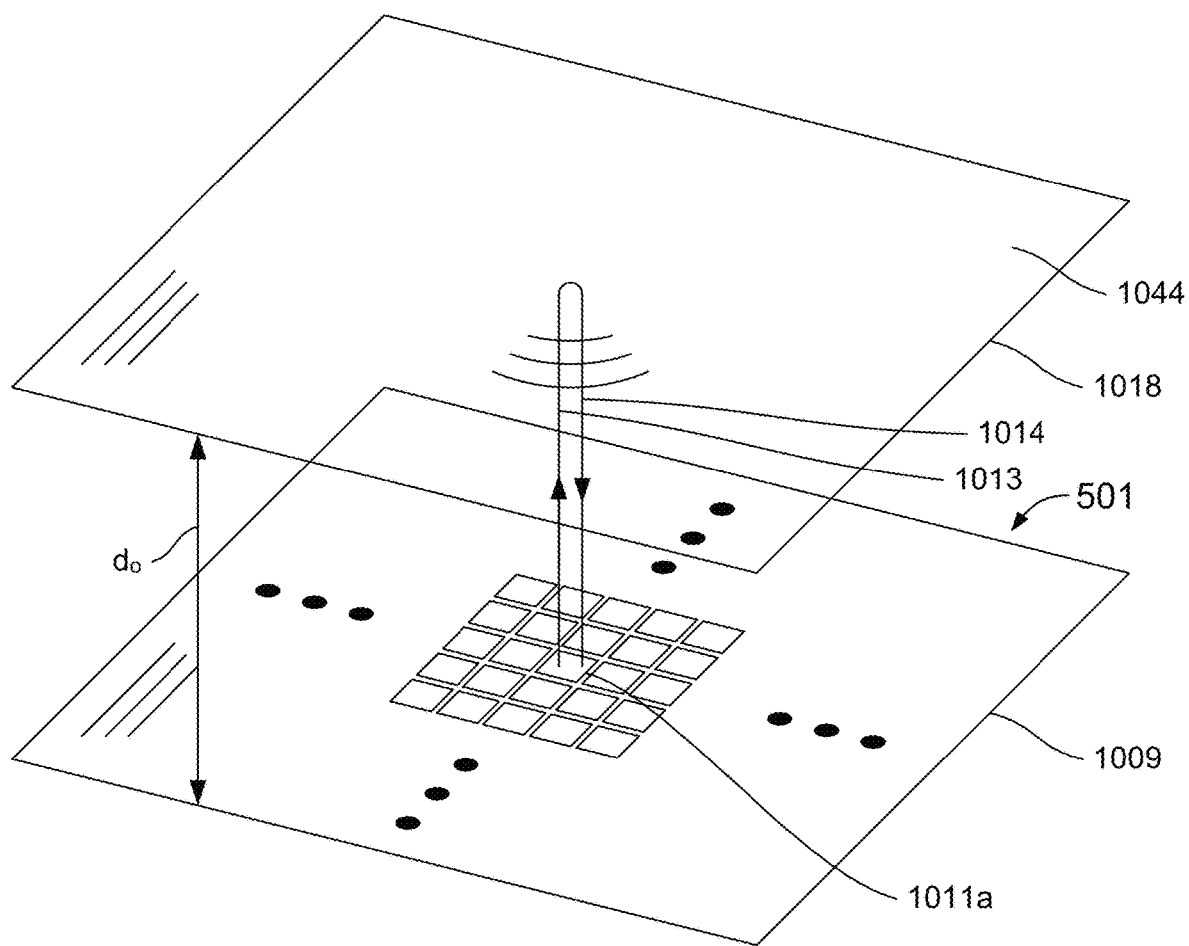
FIGS. 10A, 10B, 10C and 10D provide examples of receive-side beamforming according to some implementations.

FIG. 10A depicts a transducer segment 1011a and adjacent transducer segments of a segmented transducer array portion 1009. In this example, the transducer segment 1011a has generated a transmitted acoustic wave 1013. Here, an outer surface 1044 of a target object portion 1018 has reflected the transmitted acoustic wave 1013, producing a reflected acoustic wave 1014. FIG. 10A shows the reflected acoustic wave 1014 being received by the transducer segment 1011a. In this example, the separation between the target object surface 1044 and the transducer segment 1011a is a distance do. A 5×5 portion of transducer segments 1011 in the transducer segment array 1009 is shown to illustrate the concepts described herein, although limitations to a 5×5 array are not intended.

The transmitted acoustic wave 1013 may, in some instances, pass through one or more layers (not shown) between the array of transducer segments 1011 and the outer surface of the apparatus 501 (e.g., a TFT layer, a display stack and a cover) and through a layer of air before reaching the outer surface 1044 of the target object portion 1018. The reflected acoustic wave 1014 may arrive at the array of transducer segments 1011, where local magnitudes of the reflected acoustic wave 1014 may be detected. The first acquisition time delay between generating the transmitted acoustic wave 1013 and sampling the reflected wave 1014 may correspond to the distance do between the transducer segment 1011a and the target object surface 1044. For example, the acquisition time delay (e.g., $RGD_1$) may approximately equal the time of flight for an acoustic wave traversing twice the distance do, given by the speed of sound in the layers between the transducer segment 1011a and the target object surface 1044.

Figure 10B:
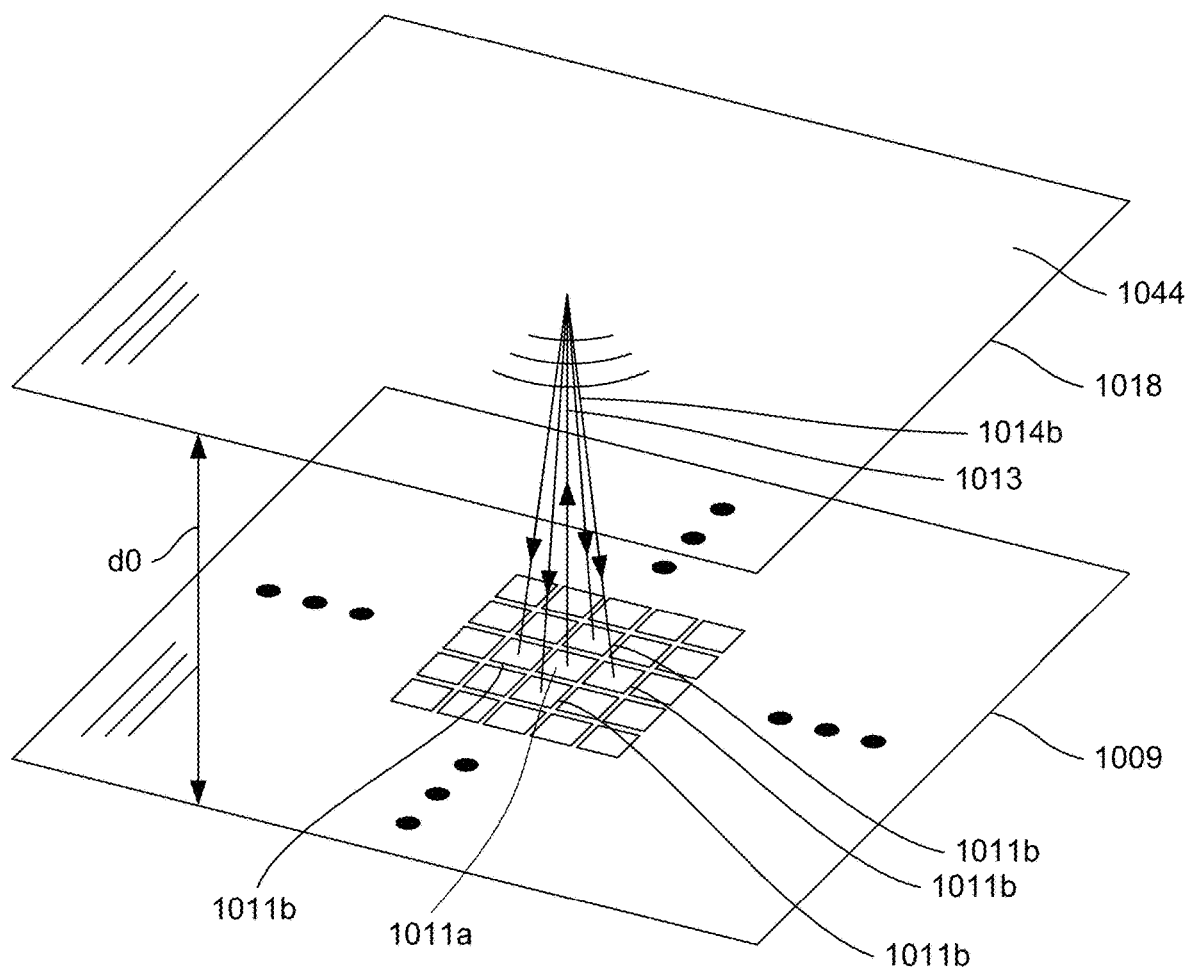

FIG. 10B depicts a reflected acoustic wave 1014 of the transmitted acoustic wave 1013 from an outer surface 1044 of a target object portion 1018 onto a first set of neighboring transducer segments 1011b near a selected transducer segment 1011a of the segmented transducer array portion 1009. The reflected acoustic wave 1014 may reach neighboring elements 1011a and 1011b. The differences in the time of flight can be used to identify the precise x/y location of the finger presence. For example, the second acquisition time delay may account for a mean (e.g. average) distance between a selected transducer segment 1011a and a set of neighboring transducer segments 1011b near the selected transducer segment 1011a (the neighboring transducer segments 1011b are shown as the transducer segments adjacent to the sides of the selected transducer segment 1011a). For example, the second acquisition time delay or equivalently the range gate delay (e.g. $RGD_2$) may approximately equal the time of flight for an acoustic wave traversing the distance do and the hypotenuse of a triangle given by the length of legs do and $d_1$, whereby $d_1$ is described below with respect to FIG. 10D. The first acquisition time delay and the second acquisition time delay can differ so as to account for a difference in phase between the reflected first acoustic wave arriving at the selected transducer segment and the reflected second acoustic wave arriving at the first set of neighboring transducer segments.

Figure 10C:
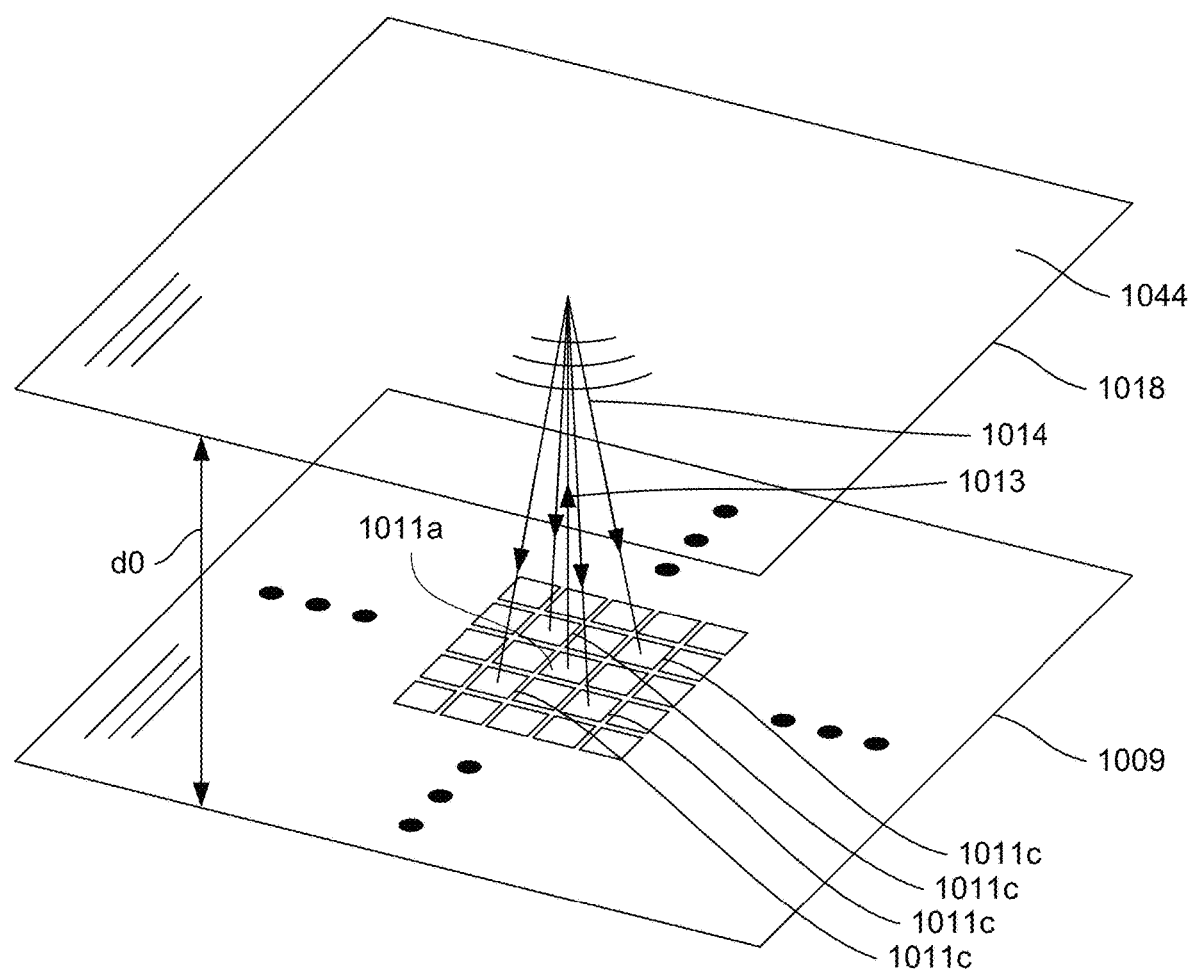

FIG. 10C depicts a reflected acoustic wave 1014 of an transmitted acoustic wave 1013 from an outer surface 1044 of a target object portion 1018 onto a second set of neighboring transducer segments 1011c near a selected transducer segment 1011a of an underlying segmented transducer array portion 1009. The times of flight for reaching the center element 1011a and its neighboring elements 1011c are different. By identifying the differences, a control system can locate precisely the x/y location of the object. For example, the third acquisition time delay may account for a mean (e.g. average) distance between a selected transducer segment 1011a and a second set of neighboring transducer segments 1011c near the selected transducer segment 1011a (the neighboring transducer segments 1011c are shown as the transducer segments in contact with the corners of the selected transducer segment 1011a). For example, the third acquisition time delay (e.g. $RGD_3$) may approximately equal the time of flight for an acoustic wave traversing the distance do and the hypotenuse of a triangle given by the length of legs $d_0$ and $d_2$, whereby $d_2$ is described below with respect to FIG. 10D.

Figure 10D:
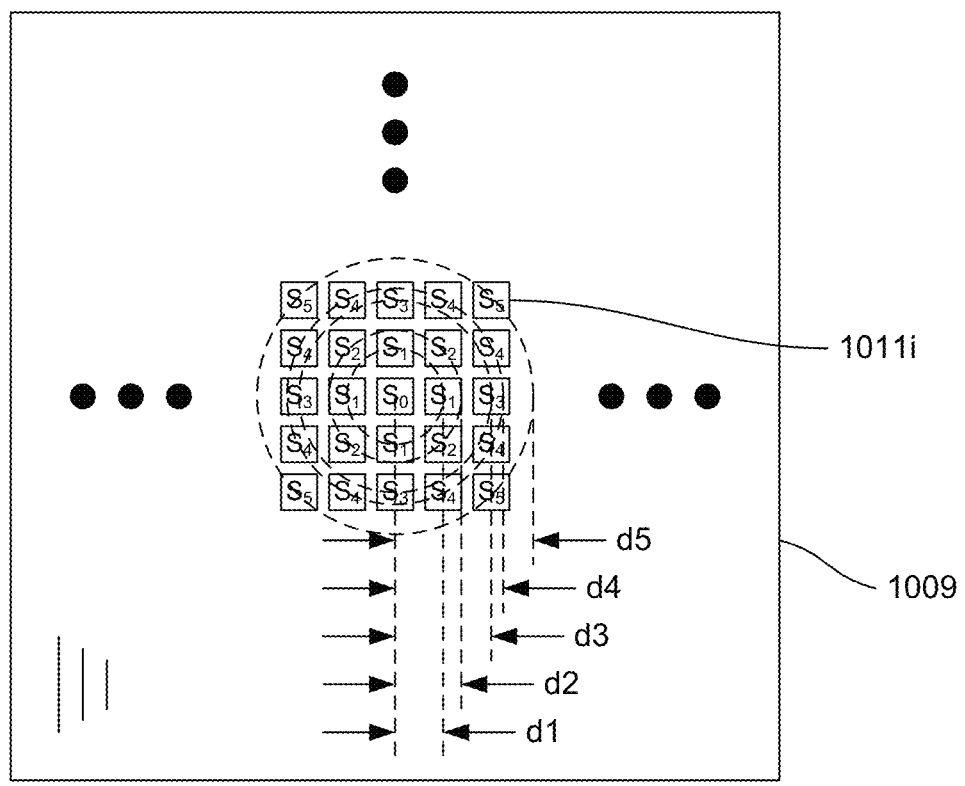

FIG. 10D illustrates a selected transducer segment 1011a ($S_0$) of a segmented transducer array portion 1009 and multiple sets of neighboring transducer segments near the selected transducer segment 1011a. The selected transducer segment 1011a may be nearly any transducer segment in the transducer segment array 10010 and is designated $S_0$ in the figure. For illustrative purposes, a circle is shown having a radius corresponding to a distance $d_1$ from the center of the selected transducer segment $S_0$ to the center of the first set of neighboring transducer segments $S_1$, with the distance $d_1$ representing the mean (average) distance between the selected transducer segment $S_0$ and the first set of neighboring transducer segments $S_1$ (e.g., the center-to-center distance between two adjacent transducer segments). A second circle is shown with a radius corresponding to a distance $d_2$ from the center of the selected transducer segment $S_0$ to the center of the second set of neighboring transducer segments $S_2$, with the distance $d_2$ representing the mean (average) distance between the selected transducer segment $S_0$ and the second set of neighboring transducer segments $S_2$. Additional circles are shown with radii corresponding to distances $d_3$, $d_4$ and $d_5$ from the center of the selected transducer segment $S_0$ to the center of the additional sets of neighboring transducer segments Sn, with the distances $d_3$, $d_4$ and $d_5$ representing the mean distance between the selected transducer segment $S_0$ and the additional sets of neighboring transducer segments $S_3$, $S_4$ and $S_5$, respectively. This procedure may be followed to identify and assign additional transducer segments to various sets of neighboring transducer segments and to allow compensation for time of flight difference due to the x/y location.

One may note that significant corrections due to finger location may be made to transducer segment output signals by acquiring additional sets of transducer segment output signals and generating corrected output signals with the transducer segment data from neighboring sets of transducer segments. In some implementations, corrections may be made by acquiring transducer segment output signals from only one set of neighboring transducer segments near each selected transducer segment (e.g., nearest neighbors). In some implementations, corrections may be made by acquiring transducer segment output signals from two different sets of neighboring transducer segments near each selected transducer segment (e.g., nearest neighbors and next-nearest neighbors). In some implementations, corrections may be made by acquiring transducer segment output signals from three, four, five or more different sets of neighboring transducer segments near each selected transducer segment.

In some alternative implementations, transducer segment output signals from two, three, four, five or more different sets of neighboring transducer segments near a selected transducer segment may be cross-correlated with transducer segment output signals from the selected transducer segment. One or more amplitude peaks or troughs may correspond with a reflection from the target object portion 1018. An acquisition time corresponding to an amplitude peak or trough may be used as a datum for time-shifting output signals from neighboring transducer segments prior to summing the signals from neighboring transducer segments with output signals from the selected transducer segment. The resulting summed signal will generally have a higher signal-to-noise ration than the output signals from the selected transducer segment.

Figure 11:
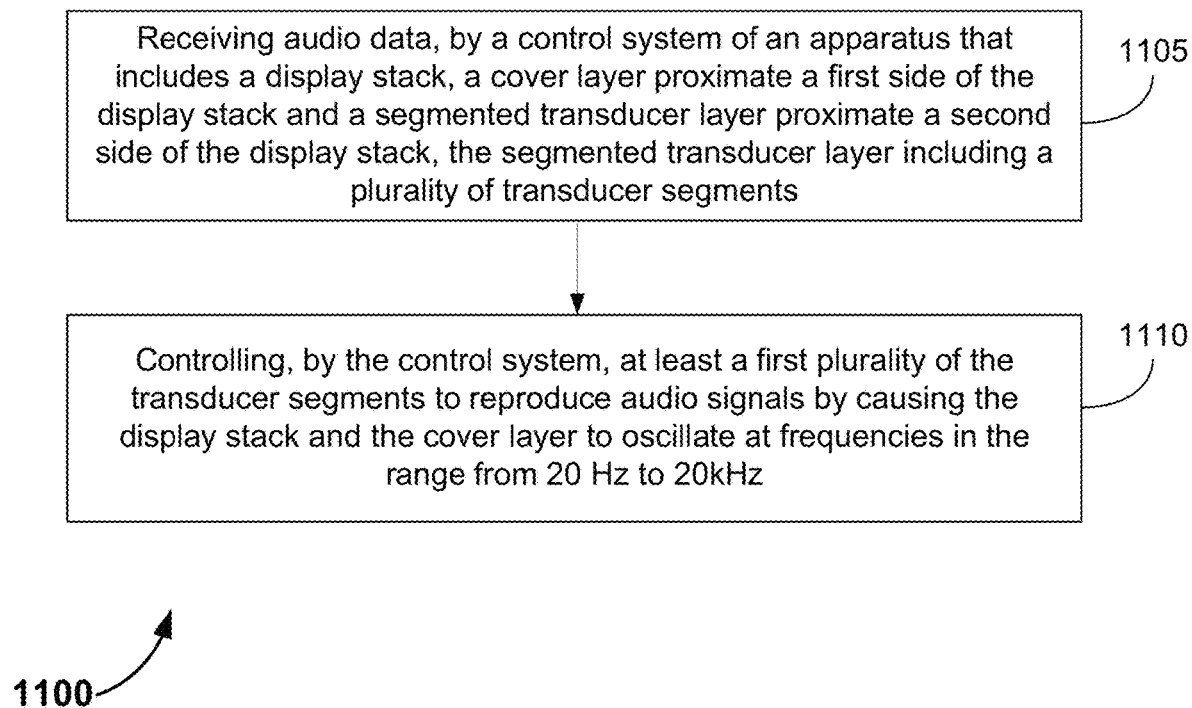
FIGS. 11 and 12 are flow diagrams that includes example blocks of methods according to two disclosed implementations.
Figure 12:
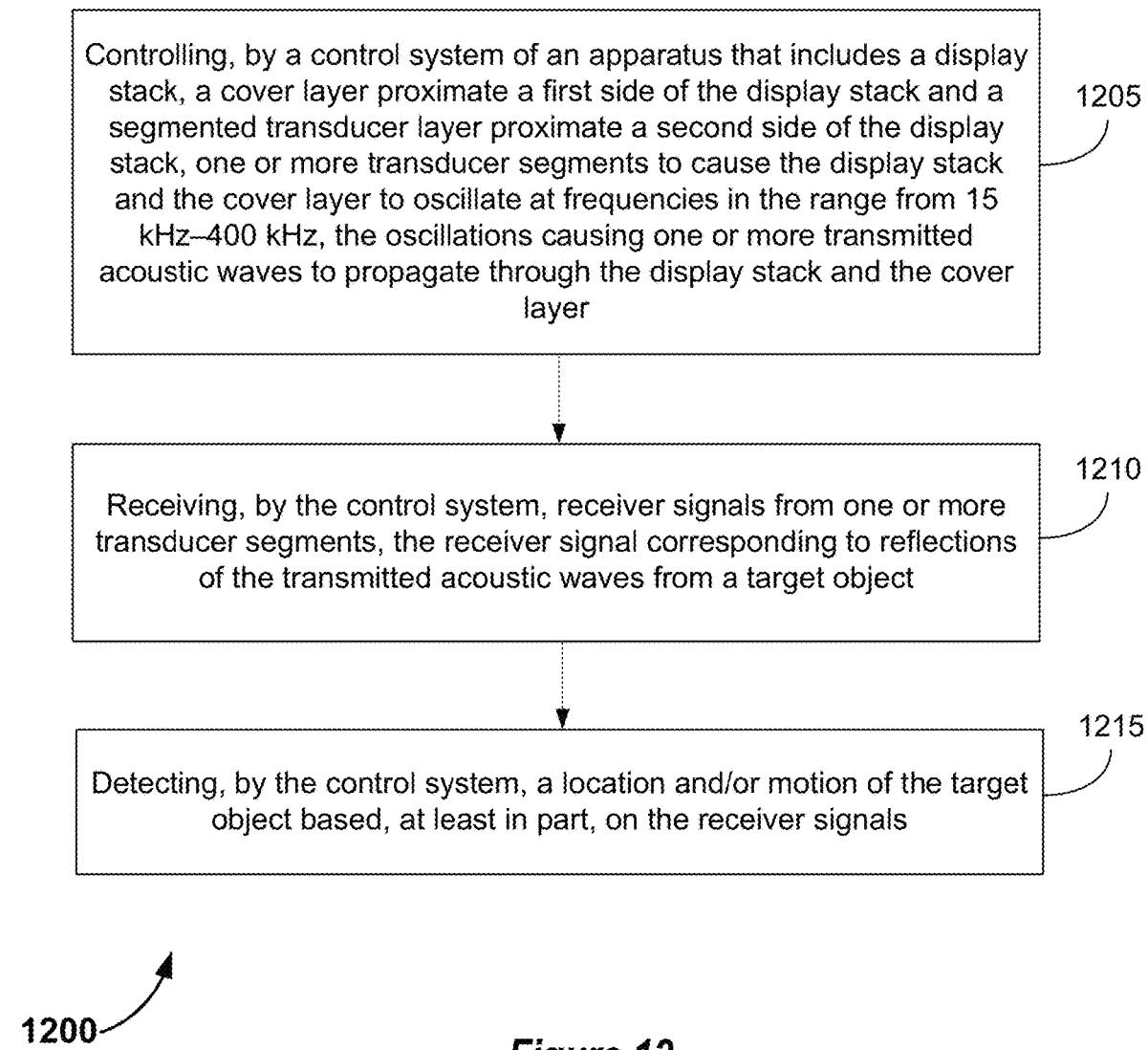

FIGS. 11 and 12 are flow diagrams that includes example blocks of methods according to two disclosed implementations. Methods 1100 and 1200 may, for example, be implemented by a control system such as the control system 506 of the apparatus 501. As with other methods disclosed herein, the methods outlined in FIGS. 11 and 12 may include more or fewer blocks than indicated. Moreover, the blocks of methods disclosed herein are not necessarily performed in the order indicated. In some instances, one or more blocks may be performed concurrently.

Referring first to FIG. 11, in this example block 1105 involves receiving audio data, by a control system of an apparatus like the apparatus 501 of FIG. 5. The audio data may, for example, be received via an interface system such as the interface system 504. In this example, the apparatus includes a display stack, a cover layer proximate a first side of the display stack and a segmented transducer layer proximate a second side of the display stack. Here, the segmented transducer layer includes a plurality of transducer segments.

According to this example, block 1110 involves reproducing audio via an in-display loudspeaker that includes the plurality of transducer segments. Here, block 1110 involves controlling, by the control system, at least a first plurality of the transducer segments to reproduce audio signals by causing the display stack and the cover layer to oscillate at frequencies, for example, in the range from 20 Hz to 20 kHz.

Referring now to FIG. 12, method 1200 involves target object location and/or motion detection by an apparatus like the apparatus 501 of FIG. 5. In this example, the apparatus includes a display stack, a cover layer proximate a first side of the display stack and a segmented transducer layer proximate a second side of the display stack. According to this implementation, the segmented transducer layer includes a plurality of transducer segments. Here, block 1205 involves controlling, a control system the apparatus, one or more transducer segments to cause the display stack and the cover layer to oscillate at frequencies, for example, in the range from 15 kHz-400 kHz. In this example, the oscillations cause one or more transmitted acoustic waves to propagate through the display stack and the cover layer.

According to this example, at least some of the transmitted acoustic waves are reflected from a target object. In this implementation, block 1210 involves receiving, by the control system, receiver signals from one or more transducer segments. In this instance, the receiver signal correspond to reflections of the transmitted acoustic waves (or a portion thereof) from the target object. In this example, block 1215 involves detecting, by the control system, a location and/or motion of the target object based, at least in part, on the receiver signals. In some examples, method 1200 may involve providing gesture detection functionality. According to some implementations, method 1200 may involve controlling the apparatus, or controlling another apparatus, according to one or more detected gestures.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. For example, in some implementations a segmented transducer array may include an array of piezoelectric micromachined ultrasonic transducers (PMUTs), an array of capacitive micromachined ultrasonic transducers (CMUTs), etc. In some such examples, PMUT elements in a single-layer array of PMUTs or CMUT elements in a single-layer array of CMUTs may be used as transmitter transducer segments and receiver transducer segments. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance, or illustration." Any implementation described herein as "exemplary" is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

Implementation examples are described in the following numbered clauses:

1. An apparatus, comprising: a display stack; a cover layer proximate a first side of the display stack; and a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency.

2. The apparatus of clause 1, further comprising a control system configured for controlling at least the first plurality of the transmitter transducer segments to reproduce audio signals by causing the display stack and the cover layer to oscillate at frequencies in a range from 20 Hz to 20 kHz.

3. The apparatus of clause 1 or clause 2, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency, wherein a mode wavelength is a distance between peaks of a display stack and cover layer oscillation mode.

4. The apparatus of any of clauses 1-3, wherein a transmitter segment thickness of each of the first plurality of the transmitter transducer segments is different from a receiver segment thickness of each of a first plurality of the receiver transducer segments.

5. The apparatus of clause 4, wherein a receiver segment piezoelectric layer thickness of each of the first plurality of the receiver transducer segments is greater than a transmitter segment piezoelectric layer thickness of each of the first plurality of the transmitter transducer segments.

6. The apparatus of any of clauses 1-5, wherein a first subset of the separate transducer segments has a first segment width and a second subset of the separate transducer segments has a second segment width.

7. The apparatus of any of clauses 1-6, further comprising a control system configured to drive the transmitter transducer segments and to obtain receiver signals from the receiver transducer segments.

8. The apparatus of any of clauses 1-7, further comprising a control system configured to drive the transmitter transducer segments in a high-order mode wherein adjacent transmitter transducer segments of the first plurality of the transmitter transducer segments are driven in opposite directions.

9. The apparatus of any of clauses 1-8, further comprising a control system configured to drive the transmitter transducer segments in a medium-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

10. The apparatus of any of clauses 1-9, further comprising a control system configured to drive the transmitter transducer segments in a low-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

11. The apparatus of any of clauses 1-10, further comprising a control system configured to perform noise cancellation based on receiver signals received from two or more receiver transducer segments.

12. The apparatus of any of clauses 1-11, wherein the spacing between at least the first plurality of the transmitter transducer segments corresponds to a display stack and cover layer oscillation mode frequency in a range from 20 Hz to 20 kHz.

13. The apparatus of any of clauses 1-12, wherein a spacing between at least a second plurality of the transmitter transducer segments corresponds to a display stack and cover layer oscillation mode for a frequency in a range from 15 KHz to 200 KHz.

14. An apparatus, comprising: a display stack; a cover layer proximate a first side of the display stack; and a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency.

15. The apparatus of clause 14, wherein the spacing between at least the first plurality of the transmitter transducer segments corresponds to a display stack and cover layer oscillation mode frequency in a range from 20 kHz-400 kHz.

16. The apparatus of clause 14 or clause 15, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

17. The apparatus of any of clauses 14-16, wherein a spacing between at least a second plurality of the transmitter transducer segments corresponds to a display stack and cover layer oscillation mode for a frequency in a range from 20 Hz to 20 kHz.

18. The apparatus of any of clauses 14-17 further comprising, a control system configured for controlling at least the first plurality of the transmitter transducer segments to cause the display stack and the cover layer to oscillate at frequencies in a range from 20 kHz-400 kHz.

19. The apparatus of any of clauses 14-18, wherein the control system is further configured for detecting a gesture based, at least in part, on ultrasonic signals received via one or more of the receiver transducer segments.

20. The apparatus of any of clauses 14-19, wherein the control system is further configured to perform noise cancellation based on receiver signals received from two or more receiver transducer segments.

21. An apparatus, comprising: a display stack; a cover layer proximate a first side of the display stack; a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency; and control means for controlling at least the first plurality of the transmitter transducer segments to reproduce audio signals by causing the display stack and the cover layer to oscillate at frequencies in a range from 20 Hz to 20 kHz.

22. The apparatus of clause 21, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

23. The apparatus of clause 21 or clause 22, wherein the spacing between at least the first plurality of the transmitter transducer segments corresponds to a display stack and cover layer oscillation mode frequency in a range from 20 Hz to 20 kHz.

24. The apparatus of any of clauses 21-23, wherein a transmitter segment thickness of each of the first plurality of the transmitter transducer segments is different from a receiver segment thickness of each of a first plurality of the receiver transducer segments.

25. The apparatus of clause 24, wherein a receiver segment piezoelectric layer thickness of each of the first plurality of the receiver transducer segments is greater than a transmitter segment piezoelectric layer thickness of each of the first plurality of the transmitter transducer segments.

26. The apparatus of any of clauses 21-25, wherein a first subset of the separate transducer segments has a first segment width and a second subset of the separate transducer segments has a second segment width.

27. The apparatus of any of clauses 21-26, further comprising a control means configured to drive the transmitter transducer segments and to obtain receiver signals from the receiver transducer segments.

28. An apparatus, comprising: a display stack; a cover layer proximate a first side of the display stack; a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency; and control means for controlling at least the first plurality of the transmitter transducer segments to cause the display stack and the cover layer to oscillate at frequencies in a range from 20 kHz-400 kHz.

29. The apparatus of clause 28, wherein the control means includes means for detecting a gesture based, at least in part, on ultrasonic signals received via one or more of the receiver transducer segments.

30. The apparatus of any of clauses 28-29, wherein the control means includes means for performing noise cancellation based on receiver signals received from two or more receiver transducer segments.

31. The apparatus of any of clauses 28-30, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

32. The apparatus of any of clauses 28-31, wherein the spacing between at least the first plurality of the transmitter transducer segments corresponds to a display stack and cover layer oscillation mode frequency in a range from 20 kHz-400 kHz.

33. The apparatus of any of clauses 28-32, wherein a spacing between at least a second plurality of the transmitter transducer segments corresponds to a display stack and cover layer oscillation mode for a frequency in a range from 20 Hz to 20 KHz.

34. The apparatus of any of clauses 28-33, wherein the control means includes means for driving the transmitter transducer segments in a high-order mode wherein adjacent transmitter transducer segments of the first plurality of the transmitter transducer segments are driven in opposite directions.

35. The apparatus of any of clauses 28-34, wherein the control means includes means for driving the transmitter transducer segments in a medium-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

36. The apparatus of any of clauses 28-35, wherein the control means includes means for driving the transmitter transducer segments in a low-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

The invention claimed is:
1. An apparatus, comprising:
a display stack;
a cover layer proximate a first side of the display stack; and
a segmented transducer array proximate a second side of the display stack, the segmented transducer array comprising a plurality of separate transducer segments, each of the separate transducer segments including a piezoelectric layer and a thin-film transistor (TFT)

layer, the separate transducer segments comprising transmitter transducer segments and receiver transducer segments, wherein a spacing between at least a first plurality of the transmitter transducer segments corresponds to a display stack and cover layer oscillation mode frequency.

2. The apparatus of claim 1, further comprising a control system configured for controlling at least the first plurality of the transmitter transducer segments to reproduce audio signals by causing the display stack and the cover layer to oscillate at frequencies in a range from 20 Hz to 20 kHz.

3. The apparatus of claim 1, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency, wherein a mode wavelength is a distance between peaks of a display stack and cover layer oscillation mode.

4. The apparatus of claim 1, wherein a transmitter segment thickness of each of the first plurality of the transmitter transducer segments is different from a receiver segment thickness of each of a first plurality of the receiver transducer segments.

5. The apparatus of claim 4, wherein a receiver segment piezoelectric layer thickness of each of the first plurality of the receiver transducer segments is greater than a transmitter segment piezoelectric layer thickness of each of the first plurality of the transmitter transducer segments.

6. The apparatus of claim 1, wherein a first subset of the separate transducer segments has a first segment width and a second subset of the separate transducer segments has a second segment width.

7. The apparatus of claim 1, further comprising a control system configured to drive the transmitter transducer segments and to obtain receiver signals from the receiver transducer segments.

8. The apparatus of claim 1, further comprising a control system configured to drive the transmitter transducer segments in a high-order mode wherein adjacent transmitter transducer segments of the first plurality of the transmitter transducer segments are driven in opposite directions.

9. The apparatus of claim 1, further comprising a control system configured to drive the transmitter transducer segments in a medium-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

10. The apparatus of claim 1, further comprising a control system configured to drive the transmitter transducer segments in a low-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

11. The apparatus of claim 1, further comprising a control system configured to perform noise cancellation based on receiver signals received from two or more receiver transducer segments.

12. The apparatus of claim 1, wherein the spacing between at least the first plurality of the transmitter transducer segments corresponds to a display stack and cover layer oscillation mode frequency in a range from 20 Hz to 20 kHz.

13. The apparatus of claim 1, wherein a spacing between at least a second plurality of the transmitter transducer segments corresponds to a display stack and cover layer oscillation mode for a frequency in a range from 15 KHz to 200 KHz.

14. An apparatus, comprising:
a display stack;
a cover layer proximate a first side of the display stack; and
a segmented transducer array proximate an opposite side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency.

15. The apparatus of claim 14, wherein the spacing between at least the first plurality of the transmitter transducer segments corresponds to a display stack and cover layer oscillation mode frequency in a range from 20 kHz-400 kHz.

16. The apparatus of claim 14, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

17. The apparatus of claim 14, wherein a spacing between at least a second plurality of the transmitter transducer segments corresponds to a display stack and cover layer oscillation mode for a frequency in a range from 20 Hz to 20 kHz.

18. The apparatus of claim 14, further comprising a control system configured for controlling at least the first plurality of the transmitter transducer segments to cause the display stack and the cover layer to oscillate at frequencies in a range from 20 kHz-400 kHz.

19. The apparatus of claim 18, wherein the control system is further configured for detecting a gesture based, at least in part, on ultrasonic signals received via one or more of the receiver transducer segments.

20. The apparatus of claim 18, wherein the control system is further configured to perform noise cancellation based on receiver signals received from two or more receiver transducer segments.

21. An apparatus, comprising:
a display stack;
a cover layer proximate a first side of the display stack;
a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency; and control means for controlling at least the first plurality of the transmitter transducer segments to reproduce audio signals by causing the display stack and the cover layer to oscillate at frequencies in a range from 20 Hz to 20 kHz.

22. The apparatus of claim 21, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

23. The apparatus of claim 21, wherein the spacing between at least the first plurality of the transmitter transducer segments corresponds to a display stack and cover layer oscillation mode frequency in a range from 20 Hz to 20 kHz.

24. The apparatus of claim 21, wherein a transmitter segment thickness of each of the first plurality of the transmitter transducer segments is different from a receiver segment thickness of each of a first plurality of the receiver transducer segments.

25. The apparatus of claim 24, wherein a receiver segment piezoelectric layer thickness of each of the first plurality of the receiver transducer segments is greater than a transmitter segment piezoelectric layer thickness of each of the first plurality of the transmitter transducer segments.

26. The apparatus of claim 21, wherein a first subset of the separate transducer segments has a first segment width and a second subset of the separate transducer segments has a second segment width.

27. The apparatus of claim 21, further comprising a control means configured to drive the transmitter transducer segments and to obtain receiver signals from the receiver transducer segments.

28. An apparatus, comprising:
a display stack;
a cover layer proximate a first side of the display stack;
a segmented transducer array proximate a second side of the display stack, the segmented transducer array comprising a plurality of separate transducer segments, each of the separate transducer segments including a piezoelectric layer and a thin-film transistor (TFT) layer, the separate transducer segments comprising transmitter transducer segments and receiver transducer segments, wherein a spacing between at least a first plurality of the transmitter transducer segments corresponds to a display stack and cover layer oscillation mode frequency; and
control means for controlling at least the first plurality of the transmitter transducer segments to cause the display stack and the cover layer to oscillate at frequencies in a range from 20 kHz-400 kHz.

29. The apparatus of claim 28, wherein the control means includes means for detecting a gesture based, at least in part, on ultrasonic signals received via one or more of the receiver transducer segments.

30. The apparatus of claim 28, wherein the control means includes means for performing noise cancellation based on receiver signals received from two or more receiver transducer segments.

31. The apparatus of claim 28, wherein a distance between centers of the first plurality of the transmitter transducer segments equals a mode wavelength, half of the mode wavelength, a quarter of the mode wavelength or an eighth of the mode wavelength corresponding to the display stack and cover layer oscillation mode frequency.

32. The apparatus of claim 28, wherein the spacing between at least the first plurality of the transmitter transducer segments corresponds to a display stack and cover layer oscillation mode frequency in a range from 20 kHz-400 kHz.

33. The apparatus of claim 28, wherein a spacing between at least a second plurality of the transmitter transducer segments corresponds to a display stack and cover layer oscillation mode for a frequency in a range from 20 Hz to 20 KHz.

34. The apparatus of claim 28, wherein the control means includes means for driving the transmitter transducer segments in a high-order mode wherein adjacent transmitter transducer segments of the first plurality of the transmitter transducer segments are driven in opposite directions.

35. The apparatus of claim 28, wherein the control means includes means for driving the transmitter transducer segments in a medium-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is not driven and a third transducer segment of the first plurality of the transmitter transducer segments that is adjacent to the second transmitter transducer segment is driven in a second direction that is opposite from the first direction.

36. The apparatus of claim 28, wherein the control means includes means for driving the transmitter transducer segments in a low-order mode wherein, at a time during which a first transmitter transducer segment of the first plurality of the transmitter transducer segments is driven in a first direction, a second transmitter transducer segment of the first plurality of the transmitter transducer segments that is adjacent to the first transmitter transducer segment is driven in the first direction and a third transducer segment of the first plurality of the transmitter transducer segments that is adjacent to the second transmitter transducer segment is driven in the first direction.

\* \* \* \* \*